United States Patent
Hata et al.

(10) Patent No.: US 6,734,503 B2
(45) Date of Patent: May 11, 2004

(54) NITRIDE-BASED SEMICONDUCTOR ELEMENT

(75) Inventors: Masayuki Hata, Kadoma (JP); Nobuhiko Hayashi, Osaka (JP); Koji Tominaga, Hirakata (JP); Yasuhiko Nomura, Moriguchi (JP); Tatsuya Kunisato, Takatsuki (JP); Hiroki Ohbo, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/211,340

(22) Filed: Aug. 5, 2002

(65) Prior Publication Data

US 2003/0030068 A1 Feb. 13, 2003

(30) Foreign Application Priority Data

Aug. 7, 2001 (JP) ........................................ 2001-239326

(51) Int. Cl.[7] .............................................. H01L 27/01
(52) U.S. Cl. ........................... 257/352; 257/21; 257/79; 257/96; 257/347
(58) Field of Search ............................ 257/21, 79, 96, 257/347, 352, 103, 184

(56) References Cited

U.S. PATENT DOCUMENTS

| | | | | |
|---|---|---|---|---|
| 6,265,727 | B1 | * | 7/2001 | Kozodoy et al. ............. 257/21 |
| 2002/0038892 | A1 | * | 4/2002 | Otani et al. .................. 257/352 |
| 2002/0117104 | A1 | * | 8/2002 | Hata et al. .................... 117/97 |
| 2002/0170489 | A1 | * | 11/2002 | Biwa et al. .................. 117/101 |

FOREIGN PATENT DOCUMENTS

| | | |
|---|---|---|
| EP | 1 184 897 A1 | 3/2000 |
| JP | 7-122520 | 5/1995 |
| JP | 11-186178 | 7/1999 |
| JP | 2001-168042 | 6/2001 |

OTHER PUBLICATIONS

R. Davis, et al "Pendeo–Epitaxial Growth and Characterization of Gallium Nitride and Related Materials", International Workshop on Nitride Semiconductors, IWN 2000, Sep. 24–27, 2000, pp. 79–81.

K. Tadatomo, et al "High Ouput Power InGaN Ultraviolet Light–Emitting Diodes Fabricated on Patterned Substrates Using Metalorganic Vapor Phase Epitaxy" Jpn. J. Appl. Phys., vol. 40 (2001), pp. L583–L585.

S. Nakamura, et al, "*Long Lifetime Violet InGaN/GaN/AlGaN–Based Semiconductor Lasers*" Bulletin of Solid State Physics and Applications, Japan Society of Applied Physics, Feb. 4, 1998, pp. 53–58.

A. Sakai, et al, "*Reduction of Threading Dislocations in GaN Films by Epitaxial Lateral Overgrowth*" Bulletin of Solid State Physics and Applications, Japan Society of Applied Physics, May 4, 1998, pp. 210–215.

"*Fundamental Science of Plasma CVD and its Application*", extended abstracts (The 48th Spring Meeting, 2001) The Japan Society of Applied Physics and Related Societies, No. 1, p. 429.

* cited by examiner

*Primary Examiner*—David Nelms
*Assistant Examiner*—Dao H. Nguyen
(74) *Attorney, Agent, or Firm*—McDermott, Will & Emery

(57) ABSTRACT

A nitride-based semiconductor element capable of effectively preventing a nitride-based semiconductor layer of a first area from cracking and reducing the degree of warpage of a substrate is obtained. This nitride-based semiconductor element comprises a first region formed on a prescribed region of a substrate and provided with an element including a first nitride-based semiconductor layer having a prescribed thickness and a second region formed on a region of the substrate other than the first region and provided with the first nitride-based semiconductor layer with a thickness smaller than the thickness in the first region. Thus, strain easily concentrates to the second region provided with the first nitride-based semiconductor layer with the smaller thickness, whereby strain of the first region provided with the element is relaxed.

32 Claims, 25 Drawing Sheets

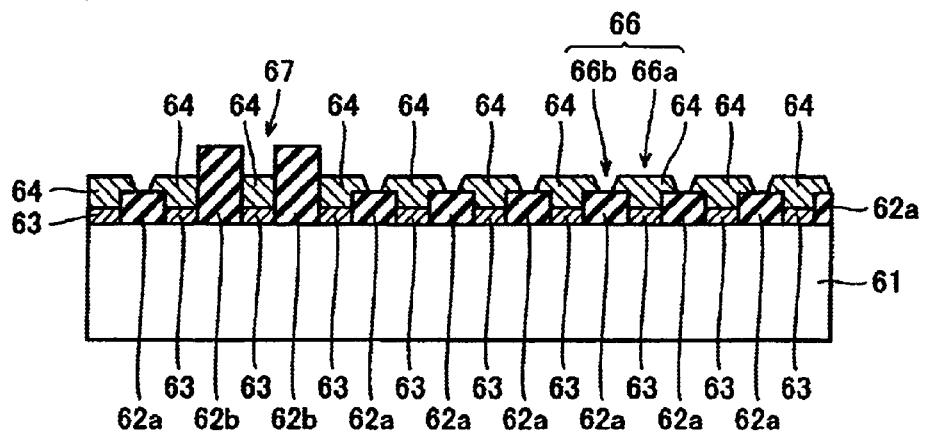
FIG.32
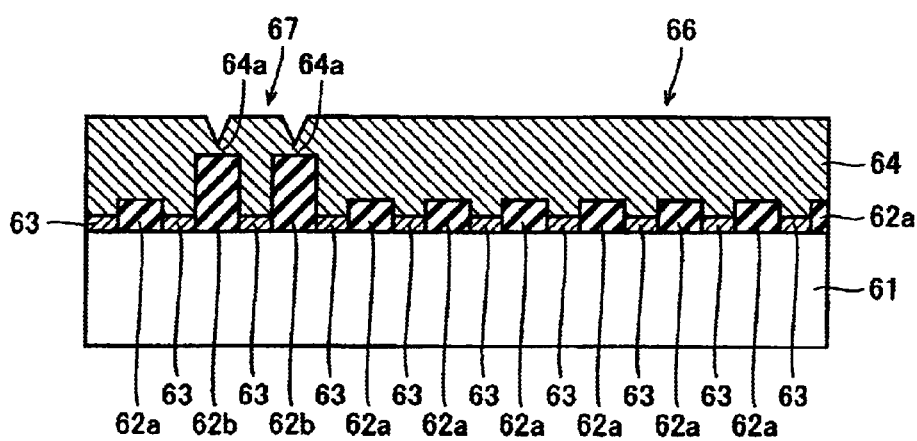
FIG.33
FIG.34

NITRIDE-BASED SEMICONDUCTOR ELEMENT

BACKGROUND OF THE INVENTION

1. Field of the Invention

The present invention relates to a nitride-based semiconductor element, and more particularly, it relates to a nitride-based semiconductor element having a nitride-based semiconductor layer.

2. Description of the Background Art

A technique of growing a nitride-based semiconductor layer, consisting of a material different from that of an underlayer, on the underlayer is known in general. In crystal growth of GaN which is one of nitride-based semiconductors, for example, a nitride-based semiconductor layer is hetero-grown on a heterogeneous substrate such as a sapphire substrate due to a small number of lattice-matching substrates. In relation to this, generally known is a technique of inserting a buffer layer grown under a low temperature between the substrate and the GaN layer in order to grow GaN having excellent crystallinity with a small number of crystal defects.

Also when the aforementioned low-temperature buffer layer is employed, however, defects of about $1 \times 10^9$ cm$^{-2}$ are still present and the density of reducible defects is limited. Further, it is difficult to reduce the density of dislocations. To this end, generally proposed is a technique employing an underlayer for reducing the density of dislocations by epitaxial lateral overgrowth (ELOG) when growing GaN. This epitaxial lateral overgrowth is disclosed in Journal of Oyo Denshi Bussei Bunkakai, Vol. 4 (1998), pp. 53 to 58 and 210 to 215, for example.

In this ELOG, a mask layer is formed on a prescribed region of the underlayer for selectively growing a GaN layer from the underlayer through the mask layer, so that the GaN layer grows in the vertical direction and then grows in the lateral direction. Dislocations are laterally bent due to the lateral overgrowth, whereby the density of dislocations reaching a flattened surface of the nitride-based semiconductor layer is remarkably reduced as compared with the underlayer from about $1 \times 10^8$ cm$^{-2}$ to less than about $1 \times 10^6$ cm$^{-2}$.

A method referred to as PENDEO, disclosed in International Workshop on Nitride Semiconductor (IWN 2000), Nagoya, p. 79, is also known as a method of reducing the density of dislocations through selective lateral growth. According to PENDEO, a nitride-based semiconductor layer is grown on a substrate and the surface of this nitride-based semiconductor layer is recessed to partially expose the substrate. The nitride-based semiconductor layer is laterally grown on projection portions of the nitride-based semiconductor layer. Further, Japanese Patent Laying-Open No. 2001-168042 or Jpn. J. Appl. Phys. 40 (2001) L583 discloses a method of laterally growing a nitride-based semiconductor layer on a substrate with recess portions.

In each of the aforementioned conventional methods employing selective lateral growth, however, the nitride-based semiconductor is frequently cracked in a subsequent process step such as a step of separation of the substrate into elements due to the difference between the thermal expansion coefficients of the mask layer and the grown nitride-based semiconductor or voids resulting from facets bonded on a portion of the mask layer.

In the conventional selective lateral growth, since the density of dislocations is reduced in the vicinity of the surface of the nitride-based semiconductor layer, it is difficult to obtain lattice relaxation by dislocations. Therefore, the nitride-based semiconductor is frequently cracked and the substrate is frequently warped.

Particularly when the nitride-based semiconductor layer has a smaller lattice constant than the substrate as in an AlGaN layer formed on a GaN substrate, for example, or the nitride-based semiconductor layer has a larger thermal expansion coefficient than the substrate such as an Si substrate or an SiC substrate, the aforementioned cracking or warpage is frequently caused.

SUMMARY OF THE INVENTION

An object of the present invention is to provide a nitride-based semiconductor element capable of preventing a nitride-based semiconductor from cracking and reducing the degree of warpage of a substrate.

Another object of the present invention is to effectively prevent a nitride-based semiconductor layer formed by selective lateral growth from cracking in the aforementioned nitride-based semiconductor element.

In order to attain the aforementioned objects, a nitride-based semiconductor element according to a first aspect of the present invention comprises a first region formed on a prescribed region of a substrate and provided with an element including a first nitride-based semiconductor layer having a prescribed thickness and a second region formed on a region of the substrate other than the first region and provided with the first nitride-based semiconductor layer with a thickness smaller than the thickness in the first region.

The nitride-based semiconductor element according to the first aspect is formed with the second region provided with the first nitride-based semiconductor layer with a thickness smaller than the thickness in the first region provided with the element as described above, whereby strain easily concentrates to the second region provided with the first nitride-based semiconductor layer with the smaller thickness. Thus, strain of the first region provided with the element is relaxed, whereby the first nitride-based semiconductor layer provided on the first region can be effectively prevented from cracking, and the degree of warpage of the substrate can be reduced. Consequently, the nitride-based semiconductor element can be formed on the first region with an excellent yield.

In the aforementioned nitride-based semiconductor element according to the first aspect, the first region provided with the element preferably includes a first portion, formed on the substrate, having difficulty in allowing growth of the first nitride-based semiconductor layer and a second portion, formed on the substrate, easily allowing growth of the first nitride-based semiconductor layer, and the second region preferably includes a third portion, formed on the substrate, having difficulty in allowing growth of the first nitride-based semiconductor layer. According to this structure, the thickness of the portion of the first nitride-based semiconductor layer formed on the second region can be easily reduced below the thickness of the portion of the first nitride-based semiconductor layer formed on the first region.

In the aforementioned nitride-based semiconductor element including the first, second and third portions, the first portion of the first region is preferably formed with a first width, and the third portion of the second region is preferably formed with a second width larger than the first width. According to this structure, the first nitride-based semiconductor layer is more difficult to be grown on the third portion of the second region having a larger width as compared with the first portion of the first region having a smaller width, whereby the thickness of the portion of the first nitride-based semiconductor layer formed on the second region can be easily reduced below the thickness of the portion of the first nitride-based semiconductor layer formed on the first region.

In the aforementioned nitride-based semiconductor element including the first, second and third portions, the first portion of the first region having difficulty in allowing growth of the first nitride-based semiconductor layer preferably includes any of a region having no buffer layer, a region having a mask layer and a region having a recess portion, the second portion of the first region easily allowing growth of the first nitride-based semiconductor layer preferably includes any of a region having a buffer layer, a region having no mask layer and a region having no recess portion, and the third portion of the second region having difficulty in allowing growth of the first nitride-based semiconductor layer preferably includes any of a region having no buffer layer, a region having a mask layer and a region having a recess portion. According to this structure, the first portion easily allowing growth of the first nitride-based semiconductor layer and the second portion having difficulty in allowing growth of the first nitride-based semiconductor layer can be easily formed on the first region provided with the element, while the third portion having difficulty in allowing growth of the first nitride-based semiconductor layer can be formed on the second region.

The aforementioned first, second and third portions can be combined in the following manner: For example, the first, second and third portions may include a region having no buffer layer, a region having a buffer layer and a region having no buffer layer respectively. Alternatively, the first, second and third portions may include a region having a mask layer, a region having no mask layer and a region having a mask layer respectively. Further alternatively, the first, second and third portions may include a region having a recess portion, a region having no recess portion and a region having a recess portion respectively. Further alternatively, the first, second and third portions may include a region having a mask layer, a region having a buffer layer and a region having a mask layer respectively.

The first, second and third portions may include a region having no buffer layer, a region having a buffer layer and a region having a mask layer respectively. Alternatively, the first, second and third portions may include a region having no buffer layer, a region having a buffer layer and a region having a recess portion respectively. Further alternatively, the first, second and third portions may include a region having a mask layer, a region having a buffer layer and a region having a recess portion respectively. Further alternatively, the first, second and third portions may include a region having a mask layer, a region having no mask layer and a region having a recess portion respectively. Further alternatively, the first, second and third portions may include a region having a recess portion, a region having no recess portion and a region having a mask layer respectively. Further alternatively, the first, second and third portions may include a region having a mask layer, a region having a buffer layer and a region having no buffer layer respectively. Further alternatively, the first, second and third portions may include a region having a recess portion, a region having no recess portion and a region having no buffer layer respectively.

In the aforementioned nitride-based semiconductor element including the first, second and third portions, the first portion of the first region having difficulty in allowing growth of the first nitride-based semiconductor layer preferably includes a region having a first mask layer of a first width, the second portion of the first region easily allowing growth of the first nitride-based semiconductor layer preferably includes a region having no mask layer, and the third portion of the second region having difficulty in allowing growth of the first nitride-based semiconductor layer preferably includes a region having a second mask layer of a second width larger than the first width. According to this structure, the first portion easily allowing growth of the first nitride-based semiconductor layer and the second portion having difficulty in allowing growth of the first nitride-based semiconductor layer can be easily formed on the first region provided with the element, while the third portion having difficulty in allowing growth of the first nitride-based semiconductor layer can be easily formed on the second region.

In the aforementioned nitride-based semiconductor element including the first, second and third portions, the first portion of the first region having difficulty in allowing growth of the first nitride-based semiconductor layer preferably includes a region of a first width having no buffer layer, the second portion of the first region easily allowing growth of the first nitride-based semiconductor layer preferably includes a region having a buffer layer, and the third portion of the second region having difficulty in allowing growth of the first nitride-based semiconductor layer preferably includes a region of a second width, larger than the first width, having no buffer layer. According to this structure, the first portion easily allowing growth of the first nitride-based semiconductor layer and the second portion having difficulty in allowing growth of the first nitride-based semiconductor layer can be easily formed on the first region provided with the element, while the third portion having difficulty in allowing growth of the first nitride-based semiconductor layer can be easily formed on the second region. The first nitride-based semiconductor layer can be grown without a selective growth mask, whereby the first nitride-based semiconductor layer can be prevented from cracking resulting from the difference between the thermal expansion coefficients of the selective growth mask and the first nitride-based semiconductor layer.

In the aforementioned nitride-based semiconductor element according to the first aspect, the first region provided with the element preferably includes a first portion, having a first recess portion of a first depth, having difficulty in allowing growth of the first nitride semiconductor layer and a second portion easily allowing growth of the first nitride-based semiconductor layer, and the second region preferably includes a third portion, having a second recess portion of a second depth larger than the first depth, having difficulty in allowing growth of the first nitride-based semiconductor layer. According to this structure, the first nitride-based semiconductor layer is more difficult to be grown on the third portion of the second region provided with the second recess portion having a larger depth as compared with the first portion of the first region provided with the first recess portion having a smaller depth, whereby the thickness of the portion of the first nitride-based semiconductor layer formed on the second region can be easily reduced as compared with that of the portion of the first nitride-based semiconductor layer formed on the first region. Further, the first nitride-based semiconductor layer can be grown without a selective growth mask, whereby the first nitride-based semiconductor layer can be prevented from cracking resulting from the difference between the thermal expansion coefficients of the selective growth mask and the first nitride-based semiconductor layer.

In the aforementioned nitride-based semiconductor element including the first, second and third portions, the first portion of the first region having difficulty in allowing growth of the first nitride-based semiconductor layer preferably includes a region having a third recess portion of a first width, the second portion of the first region easily allowing growth of the first nitride-based semiconductor layer preferably includes a region having no recess portion, and the third portion of the second region having difficulty in allowing growth of the first nitride-based semiconductor layer preferably includes a region having a fourth recess portion of a second width larger than the first width. According to this structure, the first portion easily allowing growth of the first nitride-based semiconductor layer and the second portion having difficulty in allowing growth of the first nitride-based semiconductor layer can be easily formed on the first region provided with the element and the third portion having difficulty in allowing growth of the first nitride-based semiconductor layer can be easily formed on the second region. Further, the first nitride-based semiconductor can be grown without a selective growth mask, whereby the first nitride-based semiconductor layer can be prevented from cracking resulting from the difference between the thermal expansion coefficients of the selective growth mask and the first nitride-based semiconductor layer.

In the aforementioned nitride-based semiconductor element according to the first aspect, the first region provided with the element preferably includes a first portion, having a third mask layer of a first thickness, having difficulty in allowing growth of the first nitride-based semiconductor layer and a second portion easily allowing growth of the first nitride-based semiconductor layer, and the second region preferably includes a third portion, having a fourth mask layer of a second thickness larger than the first thickness, having difficulty in allowing growth of the first nitride-based semiconductor layer. According to this structure, the first nitride-based semiconductor is more difficult to be grown on the third portion of the second region having the fourth mask of a larger thickness as compared with the first portion of the first region having the third mask layer of a smaller thickness, whereby the thickness of the portion of the first nitride-based semiconductor layer formed on the second region can be easily reduced below the thickness of the portion of the first nitride-based semiconductor layer formed on the first region.

The aforementioned nitride-based semiconductor element according to the first aspect is preferably divided into each element in the second region. According to this structure, the second region easily cracked due to concentration of strain can be effectively utilized as a region for separation of the substrate into each element.

In the aforementioned nitride-based semiconductor element according to the first aspect, the second region is preferably formed to enclose the first region in plane. According to this structure, the second region capable of relaxing strain of the first region can be formed around the first region, thereby effectively relaxing strain of the first region. In this case, the second region may be provided in the form of a lattice.

In the aforementioned nitride-based semiconductor element according to the first aspect, the second region is preferably formed to hold the first region in plane. According to this structure, the second region capable of relaxing strain of the first region can be formed on each side of the first region, thereby effectively relaxing strain of the first region. In this case, the second region may be linearly formed.

The aforementioned nitride-based semiconductor element according to the first aspect preferably further comprises a nitride-based semiconductor element layer, formed on the first nitride-based semiconductor layer, having a first area. According to this structure, the nitride-based semiconductor element layer having the first area can be formed on the first nitride-based semiconductor layer inhibited from cracking and reduced in degree of warpage of the substrate, whereby a nitride-based semiconductor element layer having excellent element characteristics can be easily formed. Consequently, a nitride-based semiconductor element having excellent element characteristics can be obtained.

In the aforementioned nitride-based semiconductor element according to the first aspect, the first nitride-based semiconductor layer preferably has a larger thermal expansion coefficient than the substrate. When the first nitride-based semiconductor layer has a large thermal expansion coefficient, the portion of the first nitride-based semiconductor layer formed on the first region is easily strained. According to the present invention, the second region capable of relaxing strain can effectively relax such strain of the portion of the first nitride-based semiconductor layer formed on the first region. In this case, the substrate may include either an Si substrate or an SiC substrate.

In the aforementioned nitride-based semiconductor element according to the first aspect, the first nitride-based semiconductor layer preferably has a smaller lattice constant than the substrate. When the first nitride-based semiconductor layer has a smaller lattice constant than the substrate, the portion of the first nitride-based semiconductor layer formed on the first region is easily strained. According to the present invention, the second region capable of relaxing strain can effectively relax such strain of the portion of the first nitride-based semiconductor layer formed on the first region.

In the aforementioned nitride-based semiconductor element according to the first aspect, dislocations are preferably laterally bent thereby reducing the density of vertical dislocations in the portion of the first nitride-based semiconductor layer located on the first region. According to this structure, a first nitride-based semiconductor layer having excellent crystallinity can be obtained.

A nitride-based semiconductor element according to a second aspect of the present invention comprises a first region formed on a prescribed region of a substrate and provided with an element including a first nitride-based semiconductor layer having a prescribed thickness and a second region formed on a region of the substrate other than the first region and provided with no first nitride-based semiconductor layer. The first region provided with the element includes a first portion, formed on the substrate, having difficulty in allowing growth of the first nitride-based semiconductor layer, and a second portion, formed on the substrate, easily allowing growth of the first nitride-based semiconductor layer, and the second region includes a third portion, formed on the substrate, having difficulty in allowing growth of the first nitride-based semiconductor layer.

The nitride-based semiconductor element according to the second aspect is formed with the second region provided with no first nitride-based semiconductor layer as described above, whereby strain of the first region provided with the element is so relaxed that the portion of the first nitride-based semiconductor layer formed on the first region can be effectively prevented from cracking and the degree of warpage of the substrate can be reduced. Consequently, the nitride-based semiconductor element can be formed on the first region with an excellent yield.

In the aforementioned nitride-based semiconductor element according to the second aspect, the first portion of the first region is preferably formed with a first width, and the third portion of the second region is preferably formed with a second width larger than the first width. According to this structure, the first nitride-based semiconductor layer is more difficult to be grown on the third portion of the second region having a larger width as compared with the first portion of the first region having a smaller width, whereby the second region can be easily prevented from formation of the first nitride-based semiconductor layer.

In the aforementioned nitride-based semiconductor element according to the second aspect, the first portion of the first region having difficulty in allowing growth of the first nitride-based semiconductor layer preferably includes any of a region having no buffer layer, a region having a mask layer and a region having a recess portion, the second portion of the first region easily allowing growth of the first nitride-based semiconductor layer preferably includes any of a region having a buffer layer, a region having no mask layer and a region having no recess portion, and the third portion of the second region having difficulty in allowing growth of the first nitride-based semiconductor layer preferably includes any of a region having no buffer layer, a region having a mask layer and a region having a recess portion. According to this structure, the first portion easily allowing growth of the first nitride-based semiconductor layer and the second portion having difficulty in allowing growth of the first nitride-based semiconductor layer can be easily formed on the first region provided with the element and the third portion having difficulty in allowing growth of the first nitride-based semiconductor layer can be easily formed on the second region.

In the aforementioned nitride-based semiconductor element according to the second aspect, the first portion of the first region having difficulty in allowing growth of the first nitride-based semiconductor layer preferably includes a region having a first mask layer of a first width, the second portion of the first region easily allowing growth of the first nitride-based semiconductor layer preferably includes a region having no mask layer, and the third portion of the second region having difficulty in allowing growth of the first nitride-based semiconductor layer preferably includes a region having a second mask layer of a second width larger than the first width. According to this structure, the first portion easily allowing growth of the first nitride-based semiconductor layer and the second portion having difficulty in allowing growth of the first nitride-based semiconductor layer can be easily formed on the first region provided with the element and the third portion having difficulty in allowing growth of the first nitride-based semiconductor layer can be easily formed on the second region.

In the aforementioned nitride-based semiconductor element according to the second aspect, the first portion of the first region having difficulty in allowing growth of the first nitride-based semiconductor layer preferably includes a region of a first width having no buffer layer, the second portion of the first region easily allowing growth of the first nitride-based semiconductor layer preferably includes a region having a buffer layer, and the third portion of the second region having difficulty in allowing growth of the first nitride-based semiconductor layer preferably includes a region of a second width, larger than the first width, having no buffer layer. According to this structure, the first portion easily allowing growth of the first nitride-based semiconductor layer and the second portion having difficulty in allowing growth of the first nitride-based semiconductor layer can be easily formed on the first region provided with the element and the third portion having difficulty in allow-ing growth of the first nitride-based semiconductor layer can be easily formed on the second region. Further, the first nitride-based semiconductor layer can be grown without a selective growth mask, whereby the first nitride-based semiconductor layer can be prevented from cracking resulting from the difference between the thermal expansion coefficients of the selective growth mask and the first nitride-based semiconductor layer.

The aforementioned nitride-based semiconductor element according to the second aspect is preferably divided into each element in the second region. According to this structure, the second region easily cracked due to concentration of strain can be effectively utilized as a region for separation of the substrate into each element.

In the aforementioned nitride-based semiconductor element according to the second aspect, the second region is preferably formed to enclose the first region in plane. According to this structure, the second region capable of relaxing strain of the first region can be formed around the first region, thereby effectively relaxing strain of the first region. In this case, the second region may be provided in the form of a lattice.

In the nitride-based semiconductor element according to the second aspect, the second region is preferably formed to hold the first region in plane. According to this structure, the second region capable of relaxing strain of the first region can be formed on each side of the first region, thereby effectively relaxing strain of the first region. In this case, the second region may be linearly formed.

The aforementioned nitride-based semiconductor element according to the second aspect preferably further comprises a nitride-based semiconductor element layer, formed on the first nitride-based semiconductor layer, having a first area. According to this structure, the nitride-based semiconductor element layer having the first area can be formed on the first nitride-based semiconductor layer inhibited from cracking and reduced in degree of warpage of the substrate, whereby a nitride-based semiconductor element layer having excellent element characteristics can be easily formed. Consequently, a nitride-based semiconductor element having excellent element characteristics can be obtained.

In the aforementioned nitride-based semiconductor element according to the second aspect, the first nitride-based semiconductor layer preferably has a larger thermal expansion coefficient than the substrate. When the first nitride-based semiconductor layer has a large thermal expansion coefficient, the portion of the first nitride-based semiconductor layer formed on the first region is easily strained. According to the present invention, the second region capable of relaxing strain can effectively relax such strain of the portion of the first nitride-based semiconductor layer formed on the first region. In this case, the substrate may include either an Si substrate or an SiC substrate.

In the aforementioned nitride-based semiconductor element according to the second aspect, the first nitride-based semiconductor layer preferably has a smaller lattice constant than the substrate. When the first nitride-based semiconductor layer has a small lattice constant, the portion of the first nitride-based semiconductor layer formed on the first region is easily strained. According to the present invention, the second region capable of relaxing strain can effectively relax such strain of the portion of the first nitride-based semiconductor layer formed on the first region.

In the aforementioned nitride-based semiconductor element according to the second aspect, dislocations are preferably laterally bent thereby reducing the density of vertical dislocations in the portion of the first nitride-based semiconductor layer located on the first region. According to this structure, a first nitride-based semiconductor layer having excellent crystallinity can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 30 to 33 are sectional views for illustrating a method of forming a nitride-based semiconductor element according to a seventh embodiment of the present invention;

FIGS. 34 to 39 are sectional views for illustrating a method of forming a nitride-based semiconductor element according to an eighth embodiment of the present invention;

DESCRIPTION OF THE PREFERRED EMBODIMENTS

Embodiments of the present invention are now described with reference to the drawings.

First Embodiment

Figure 1:
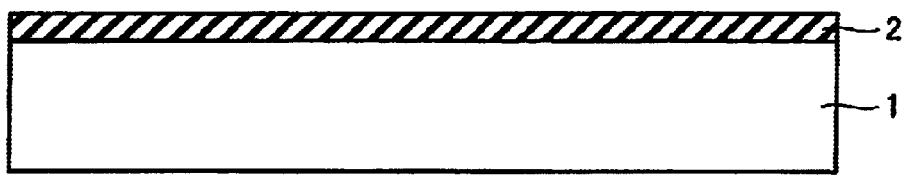
FIGS. 1 to 5 are sectional views for illustrating a method of forming a nitride-based semiconductor element according to a first embodiment of the present invention.

A method of forming a nitride-based semiconductor element according to a first embodiment of the present invention is described with reference to FIG. 1.

Figure 2:
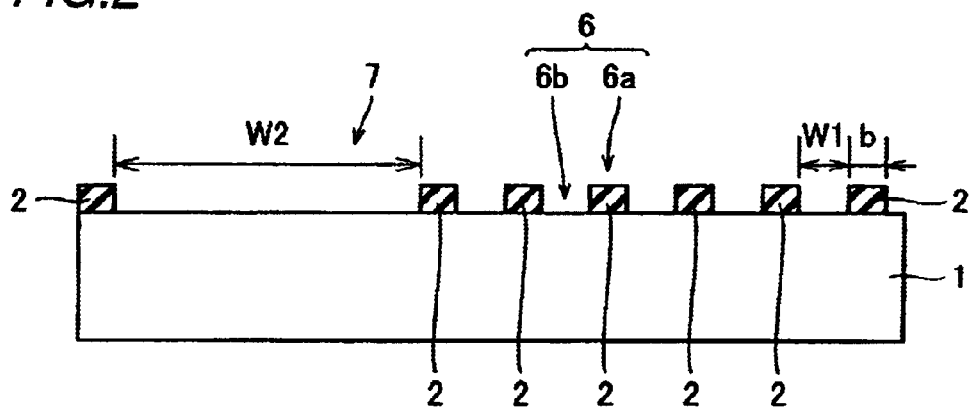

First, an AlGaN buffer layer 2 of undoped AlGaN having a thickness of about 15 nm is formed on the C-plane of a sapphire substrate 1 by MOVPE (metal organic vapor phase epitaxy) while holding the substrate temperature at 600° C. Thereafter prescribed regions of the AlGaN buffer layer 2 are etched by RIE (reactive ion etching) or the like, thereby obtaining a shape shown in FIG. 2. In this case, the AlGaN buffer layer 2 grown under a low temperature is in a non-single-crystalline state. Therefore, the AlGaN buffer layer 2 is easier to etch as compared with a layer of GaN.

A first area is an area on which a domain having device function comprising nitride semiconductor layers is formed. In the light-emitting device, a light-emitting domain is formed on the first area. In the first area 6, the width W1 for etching the AlGaN buffer layer 2 is preferably about 1 $\mu$m to 40 $\mu$m, and the width b of portions of the AlGaN buffer layer 2 left unetched is preferably 1 $\mu$m to 40 $\mu$m. According to the first embodiment, the widths W1 and b are set to 5 $\mu$m and 2 $\mu$m respectively. Thus, a plurality of striped AlGaN buffer layers 2 are formed on the first area 6 at prescribed intervals, while partially exposing the sapphire substrate 1 between the AlGaN buffer layers 2.

In the first area 6, the regions formed with the AlGaN buffer layers 2 constitute second portions 6a easily allowing growth of GaN layers, and the regions having no AlGaN buffer layers 2 constitute first portions 6b having difficulty in allowing growth of GaN layers. The second and first portions 6a and 6b form the first area 6. This first area 6 is an example of the "first region" according to the present invention.

In the first area 6, the width W1 of the etched parts and the width b of the left AlGaN buffer layers 2 are preferably set to values within ranges enclosed with the following formulas (1), (2) and (3):

$$b+W1 \leq 40 \ \mu m \quad (1)$$

$$b \geq 1 \ \mu m \quad (2)$$

$$W1 \geq 1 \ \mu m \quad (3)$$

If the width W1 of the etched parts is smaller than 1 $\mu$m and the width b of the left AlGaN buffer layers 2 is smaller than 1 $\mu$m, it is difficult to pattern the AlGaN buffer layers 2 by etching. If the width W1 of the etched parts and the width b of the left AlGaN buffer layers 2 do not satisfy the relation of the above formula (1), it is difficult to smooth GaN layers 3 grown on the AlGaN buffer layers 2 formed by patterning. In other words, b+W1 indicates the pitch of the AlGaN buffer layers 2, and the surfaces of the GaN layers 3 grown on the AlGaN buffer layers 2 can be smoothed when this pitch is not more than 40 μm.

A second area is an area on which a domain having device function is not formed. In the light-emitting device, no light-emitting domain is formed on the second area. In the step shown in FIG. 2, the second area 7 is formed to be adjacent to the first area 6. In the second area 7, the width W2 for etching the AlGaN buffer layer 2 is preferably at least about 50 μm. According to the first embodiment, the width W2 is set to 50 μm. In other words, the width W2 is set larger than the width W1. The second area 7 is an example of the "second region" and the "third portion" according to the present invention.

Figure 3:
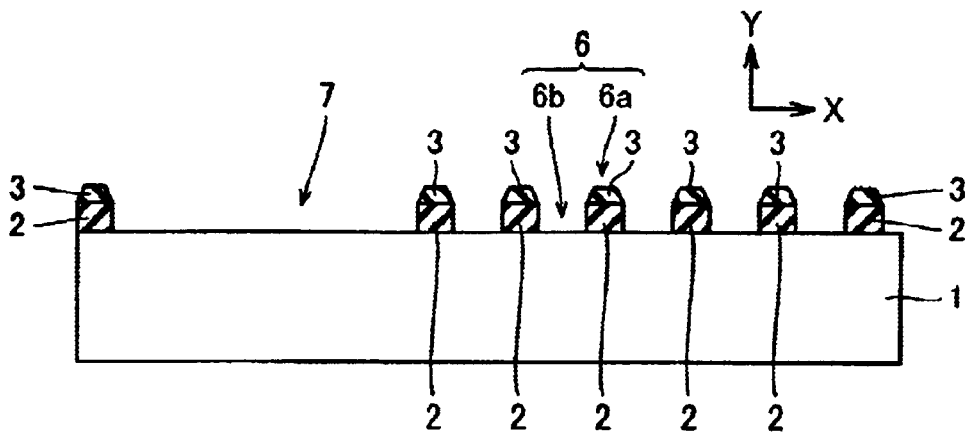
Figure 4:
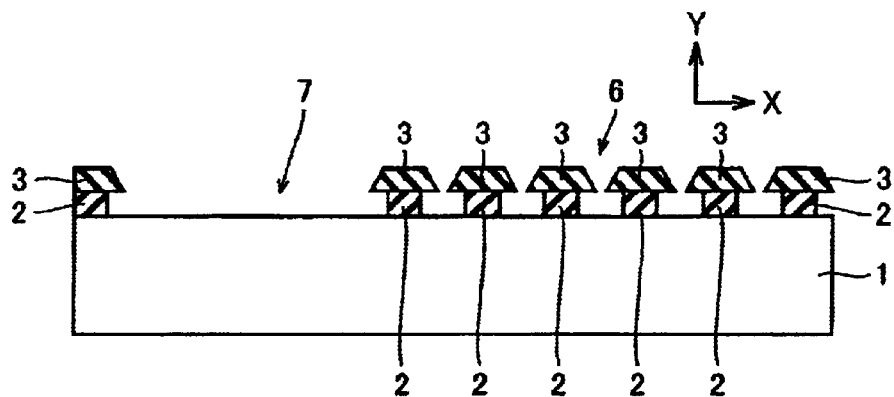

After the AlGaN buffer layers 2 are formed in the aforementioned manner, the GaN layers 3 of undoped GaN are laterally grown by MOVPE while keeping the substrate temperature at 1150° C., as shown in FIG. 3. The GaN layers 3 and the sapphire substrate 1 have different lattice constants and hence the GaN layers 3 are difficult to be grown on the sapphire substrate 1 if not through the AlGaN buffer layers 2. In the initial growth stage, therefore, the GaN layers 3 are selectively grown on the AlGaN buffer layers 2. In this case, the GaN layers 3 are grown along arrow Y (c-axis direction) in FIG. 3. In this state, a large number of dislocations formed around the sapphire substrate 1 are present in the GaN layers 3.

Following progress of the growth along arrow Y, the GaN layers 3 grown on the AlGaN buffer layers 2 are also grown along arrow X (lateral direction). Thus, the GaN layers 3 are formed also above portions of the sapphire substrate 1 exposed between the AlGaN buffer layers 2.

Following the aforementioned lateral growth of the GaN layers 3, the dislocations in the GaN layers 3 are also laterally bent in the direction parallel to the (0001) planes of the GaN layers 3. Thus, the density of dislocations propagating in the c-axis direction is uniformly reduced in the GaN layers 3.

Figure 5:
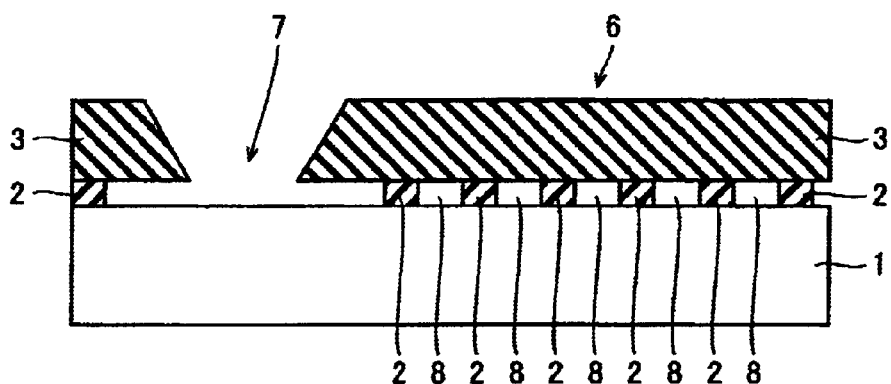

Following further growth, the GaN layers 3 having a facet structure coalesce into a continuous film on the first area 6, as shown in FIG. 5. Thus, a GaN layer 3 of about 10 μm in thickness having a flattened upper surface is formed on the first area 6. The density of dislocations is reduced in the surface of the GaN layer 3 formed in the aforementioned manner, whereby excellent crystallinity can be attained. Voids 8 are formed between the AlGaN buffer layers 2.

In the second area 7, on the other hand, the laterally grown GaN layer 3 does not coalesce due to the large width W2 of the region having no AlGaN buffer layer 2. Thus, the second area 7 is provided with a region having no GaN layer 3.

According to the first embodiment, the second area 7 is provided with the region having no GaN layer 3 as hereinabove described so that strain of the GaN layer 3 located on the first area 6 can be relaxed, whereby the GaN layer 3 located on the first area 6 can be effectively prevented from cracking and the degree of warpage of the sapphire substrate 1 can be reduced. Consequently, a nitride-based semiconductor element can be formed on the first area 6 with an excellent yield.

When a nitride-based semiconductor element layer including a first area is formed on the GaN layer 3 having excellent crystallinity with a low density of dislocations in the first area 6 according to the first embodiment, excellent crystallinity can be attained in the nitride-based semiconductor element layer and cracking can be prevented in a step of separation of the substrate into elements or the like. Thus, a nitride-based semiconductor element having excellent element characteristics and high reliability can be obtained.

According to the first embodiment, the plurality of striped AlGaN buffer layers 2 are formed on the sapphire substrate 1 as hereinabove described, whereby the GaN layer 3 can be laterally grown without a selective growth mask. Thus, the density of dislocations can be reduced without employing a selective growth mask. Further, cracking resulting from difference between the thermal expansion coefficients of the selective growth mask and GaN as well as voids can be prevented.

According to the first embodiment, further, the GaN layer 3 is directly formed on the AlGaN buffer layers 2 provided on the sapphire substrate 1, whereby the number of growth steps as well as the total thickness can be reduced as compared with a case of providing an underlayer.

Second Embodiment

Referring to FIGS. 6 to 10, an n-type Si substrate 11 is employed and a selective growth mask 13 is formed on a second area 17 according to a second embodiment of the present invention, dissimilarly to the aforementioned first embodiment. The second embodiment is now described in detail.

Figure 6:
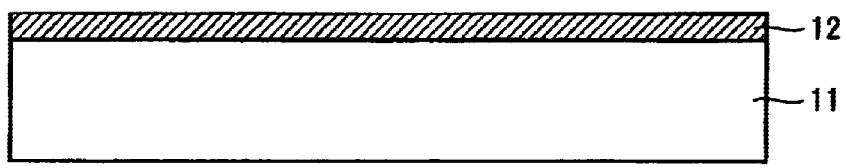
FIGS. 6 to 10 are sectional views for illustrating a method of forming a nitride-based semiconductor element according to a second embodiment of the present invention.
Figure 7:
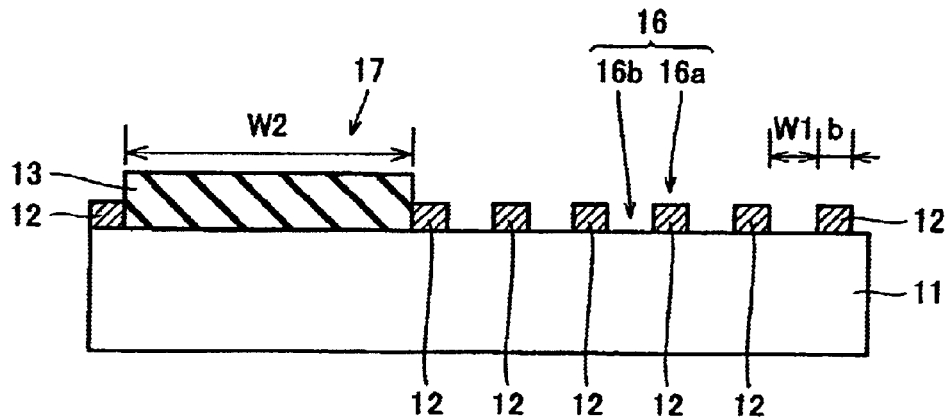

As shown in FIG. 6, an AlGaN buffer layer 12 of n-type $Al_{0.09}Ga_{0.91}N$ having a thickness of about 0.05 μm is formed on the n-type Si (111) substrate 11 (hereinafter referred to as "n-type Si substrate 11") by MOVPE while keeping the substrate temperature at 1150° C. Prescribed regions of the AlGaN buffer layer 12 are etched by RIE or the like, thereby obtaining a shape shown in FIG. 7. In a first area 16, the width W1 for partially etching the AlGaN buffer layer 12 is preferably about 1 μm to 40 μm, and the width b of portions of the AlGaN buffer layer 12 left unetched is preferably about 1 μm to 40 μm. According to the second embodiment, the widths W1 and b are set to 5 μm and 2 μm respectively. Thus, a plurality of striped AlGaN buffer layers 12 are formed at prescribed intervals while exposing portions of the n-type Si substrate 11 between the AlGaN buffer layers 12.

The selective growth mask layer 13 of $SiO_2$ or the like is formed on the second area 17. The width W2 of the selective growth mask layer 13 is preferably at least 50 μm. According to the second embodiment, the width W2 is set to 50 μm.

In the first area 16, the portions formed with the AlGaN buffer layers 12 constitute second portions 16a easily allowing growth of GaN layers 14, and the exposed portions of the n-type Si substrate 1 constitute first portions 16b having difficulty in allowing growth of the GaN layers 14. The second and first portions 16a and 16b form the first area 16. The first area 16 is an example of the "first region" according to the present invention, and the second area 17 is an example of the "second region" and the "third portion" according to the present invention.

Figure 8:
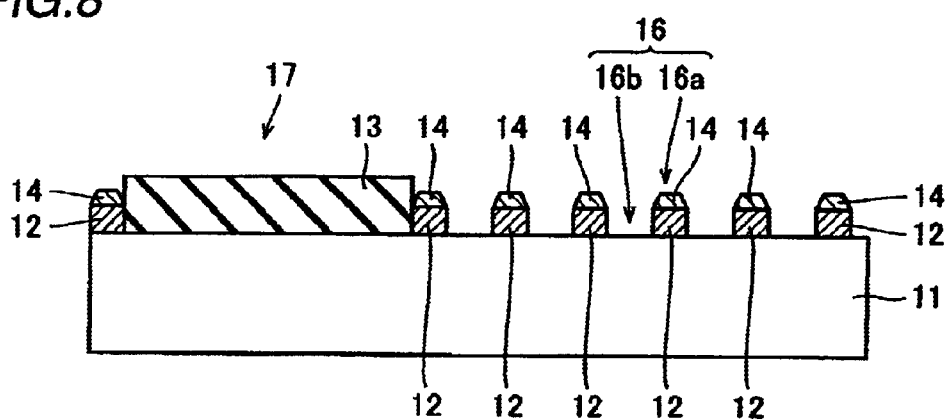

Then, the GaN layers 14 of n-type GaN are grown on the AlGaN buffer layers 12 by MOVPE while keeping the substrate temperature at 1150°, as shown in FIG. 8.

Figure 9:
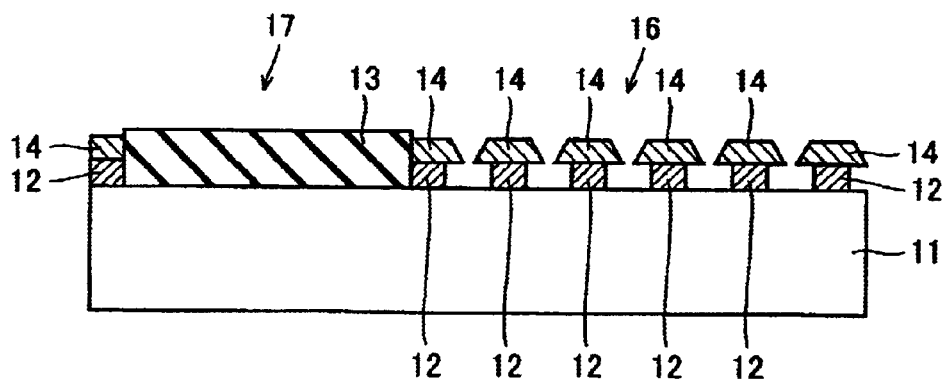

The GaN layers 14 are laterally grown thereby forming the GaN layers 14 also above the exposed portions (the second portions 16b) of the n-type Si substrate 11, as shown in FIG. 9.

Figure 10:
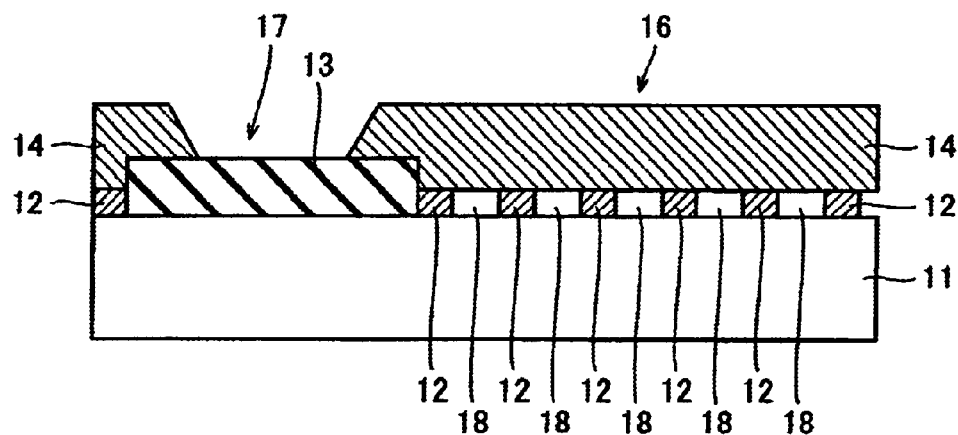

Finally, a GaN layer 14 of about 10 μm in thickness having a flattened upper surface is formed on the first area 16, as shown in FIG. 10. In this case, no laterally grown GaN layer 14 coalesces on the second area 17 formed with the wide selective growth mask layer 13. Therefore, the second area 17 is provided with a region having no GaN layer 14.

According to the second embodiment, the second area 17 relaxes strain of the GaN layer 14 located on the first area 16, whereby the GaN layer 14 located on the first area 16 can be effectively prevented from cracking and the degree of warpage of the substrate 11 can be reduced. Consequently, a nitride-based semiconductor element can be formed on the first area 16 with an excellent yield.

Particularly in the second embodiment, cracking or warpage is easily caused due to the thermal expansion coefficient of the GaN layer 14 larger than that of the n-type Si substrate 11. Therefore, the second embodiment has large effects of preventing cracking and warpage.

The remaining effect of the second embodiment is similar to that of the first embodiment.

Third Embodiment

Referring to FIGS. 11 to 15, GaN layers 24 are selectively grown through overhanging mask layers 22a and 22b according to a third embodiment of the present invention, dissimilarly to the aforementioned first and second embodiments. The third embodiment is now described in detail.

Figure 11:
FIGS. 11 to 15 are sectional views for illustrating a method of forming a nitride-based semiconductor element according to a third embodiment of the present invention.
Figure 12:
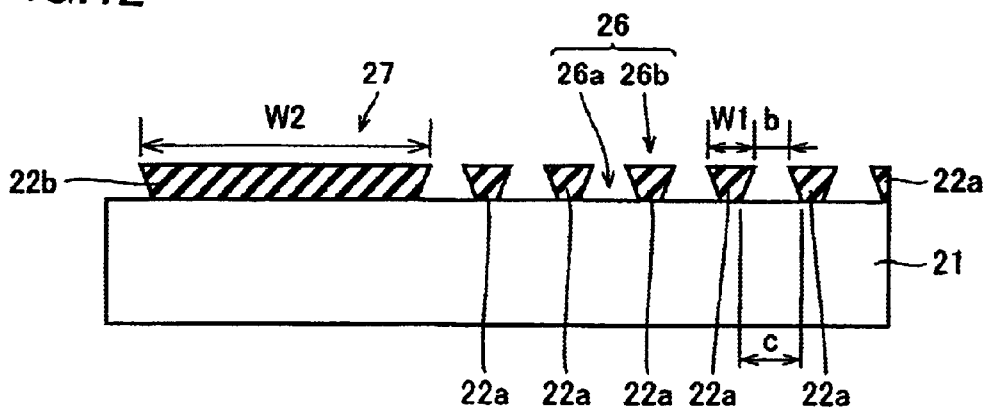

First, an SiN layer 22 is formed on an n-type Si (111) substrate 21 (hereinafter referred to as "n-type Si substrate 21"), as shown in FIG. 11. The SiN layer 22 is partially etched thereby forming inverse mesa (inverse trapezoidal) mask layers 22a and 22b consisting of SiN and having overhangs as shown in FIG. 12. The minimum distance b between adjacent ones of the mask layers 22a formed on a first area 26 is smaller than the width c of exposed portions of the n-type Si substrate 21 located between the adjacent mask layers 22a.

The width W1 of the mask layers 22a is preferably about 1 μm to 40 μm, and the minimum distance b between the adjacent mask layers 22a is preferably about 1 μm to 40 μm. According to the third embodiment, the width W1 and the distance b are set to 4 μm and 2 82 m respectively, for example. The portions of the n-type Si substrate 21 exposed in the first area 26 constitute second portions 26a easily allowing growth of the GaN layers 24. The portions formed with the mask layers 22a constitute first portions 26b having difficulty in allowing growth of the GaN layers 24. The second and first portions 26a and 26b form the first area 26. The first area 26 is an example of the "first region" according to the present invention. The mask layers 22a are examples of the "first mask layer" according to the present invention.

The wide mask layer 22b is formed on a second area 27. More specifically, the width W2 of the mask layer 22b formed on the second area 27 is preferably at least 50 μm, and the distance between the mask layer 22b and the mask layer 22a adjacent thereto is preferably about 1 μm to 40 μm. According to the third embodiment, the width W2 is set to 50 μm. The second area 27 is an example of the "second region" and the "third portion" according to the present invention. The mask layer 22b is an example of the "second mask layer" according to the present invention.

Figure 13:
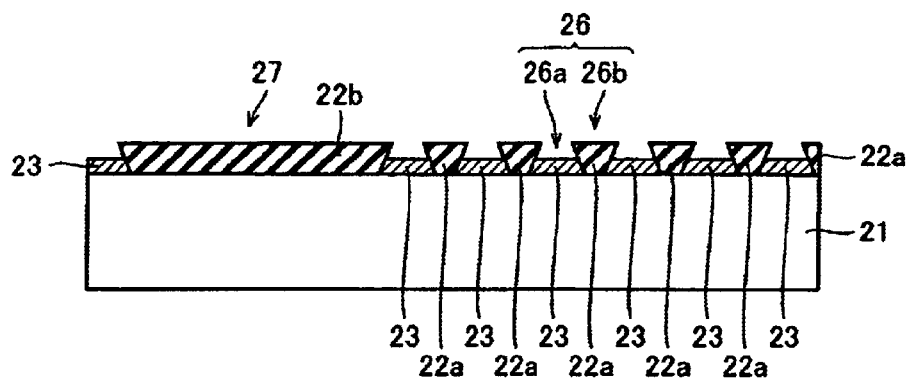

After formation of the aforementioned inverse mesa mask layers 22a and 22b having overhangs, n-type AlGaN buffer layers 23 having a thickness of about 10 nm to about 50 nm are formed on the exposed surface portions of the n-type Si substrate 21 by MOVPE or HVPE (hydride vapor phase epitaxy) through the mask layers 22a and 22b serving as selective growth masks under a temperature condition of about 1100° C., as shown in FIG. 13.

Figure 14:
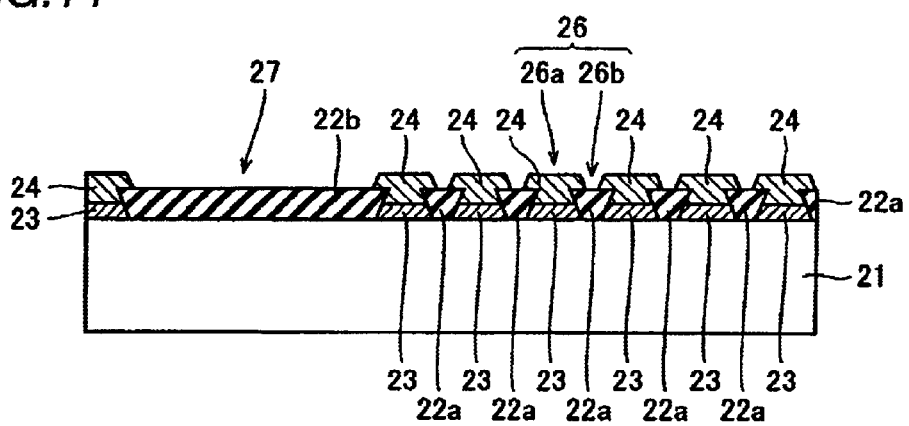
Figure 15:
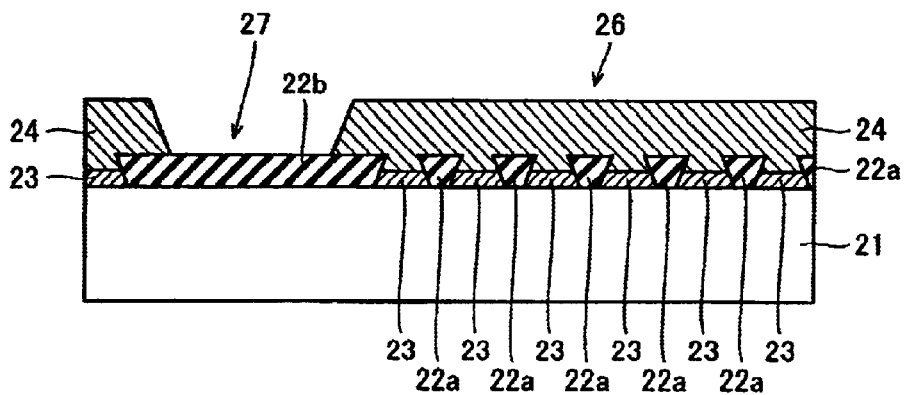

Then, the n-type GaN layers 24 are selectively laterally grown on the AlGaN buffer layers 23 and the mask layers 22a and 22b through the mask layers 22a and 22b serving as selective growth masks, as shown in FIG. 14. In this case, raw material is difficult to reach the portions located under the overhangs of the mask layers 22a and 22b, and hence trapezoidal facets are easily formed from the stage of initial growth of the n-type GaN layers 24. Therefore, lateral growth is prompted from the stage of initial growth of the n-type GaN layers 24, whereby the n-type GaN layers 24 are formed with a lower density of dislocations. Finally, a GaN layer 24 of about 10 μm in thickness having a flattened upper surface is formed on the first area 26, as shown in FIG. 15. In this case, the second area 27 is provided with a region having no n-type GaN layer 24 due to the presence of the wide mask layer 22b.

According to the third embodiment, the n-type GaN layer 24 having a lower density of dislocations can be easily formed by employing the inverse mesa mask layers 22a having overhangs and the region having no n-type GaN layer 24 can be provided on the second area 27 through the wide mask layer 22b, as hereinabove described. Thus, the region of the second area 27 having no n-type GaN layer 24 relaxes strain of the n-type GaN layer 24 located on the first area 26, whereby the n-type GaN layer 24 of the first area 26 can be effectively prevented from cracking and the degree of warpage of the substrate 21 can be reduced. Consequently, a nitride-based semiconductor element can be formed on the first area 26 with an excellent yield.

The remaining effect of the third embodiment is similar to those of the aforementioned first and second embodiments.

Fourth Embodiment

Referring to FIGS. 16 to 19, nitride-based semiconductor layers are formed on a first area 36 by lateral growth through a plurality of striped recess portions 34 while forming a region having no nitride-based semiconductor layer (GaN layer) on a second area 37 through a mask layer 35 according to a fourth embodiment of the present invention, dissimilarly to the aforementioned first to third embodiments. The fourth embodiment is now described in detail.

Figure 16:
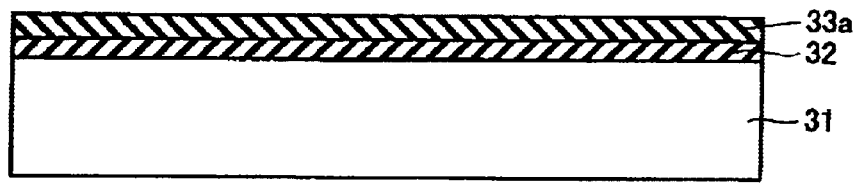
FIGS. 16 to 19 are sectional views for illustrating a method of forming a nitride-based semiconductor element according to a fourth embodiment of the present invention.
Figure 17:
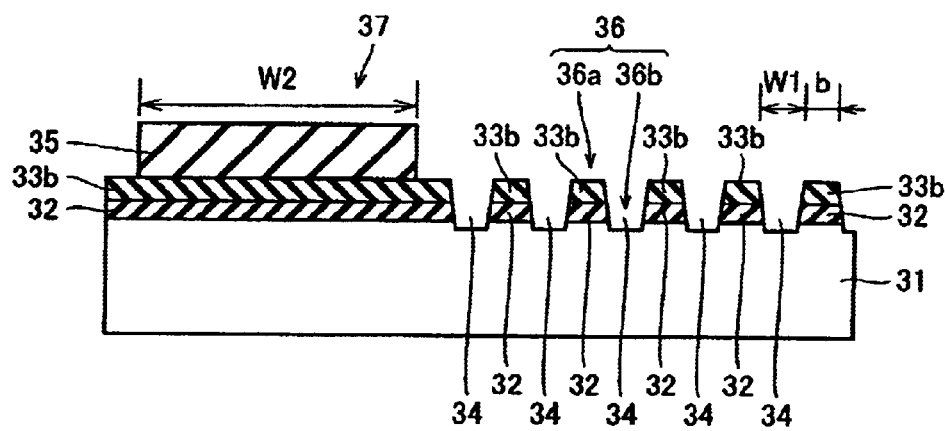

First, a low-temperature buffer layer 32 is formed on a sapphire substrate 31, followed by formation of a GaN layer 33a for serving as an underlayer in a thickness of about 2 μm by MOVPE or HVPE, as shown in FIG. 16. Prescribed regions of the GaN layer 33a serving as an underlayer are etched by RIE or the like, thereby forming the plurality of striped recess portions 34 extending in a prescribed direction on the first area 36, as shown in FIG. 17.

In this case, the width W1 of the recess portions 34 is preferably set to several μm to several 10 μm. The width b of projection portions 33b in the first area 36 is preferably set to several 100 nm to several 10 μm. The depth of the recess portions 34 is preferably set to several nm to several μm. According to the fourth embodiment, the width W1 of the recess portions 34 is set to about 5 μm, the width b of the projection portions 33a is set to 2 μm and the depth of the recess portions 34 is set to at least 2 μm, for example. While the recess portions 34 having the depth of at least 2 μm are formed by exposing the sapphire substrate 31 or slightly etching the surface of the sapphire substrate 31 in the fourth embodiment, the present invention is not restricted to this but recess portions 34 having a depth (e.g., about 1 μm) less than 2 μm may alternatively be formed by etching only the surface of the GaN layer 33 serving as an underlayer.

The projection portions 33a constitute second portions 36a easily allowing growth of GaN layers, and the recess portions 34 constitute first portions 36b having difficulty in allowing growth of GaN layers. The second and first portions 36a and 36b form the first area 36. The first area 36 is an example of the "first region" according to the present invention.

The mask layer 35 consisting of SiN or the like is formed on the second area 37 by photolithography and etching. The width W2 of the mask layer 35, preferably at least 50 μm, is set to 50 μm according to the fourth embodiment. The second area 37 is an example of the "second region" and the "third portion" according to the present invention.

Figure 18:
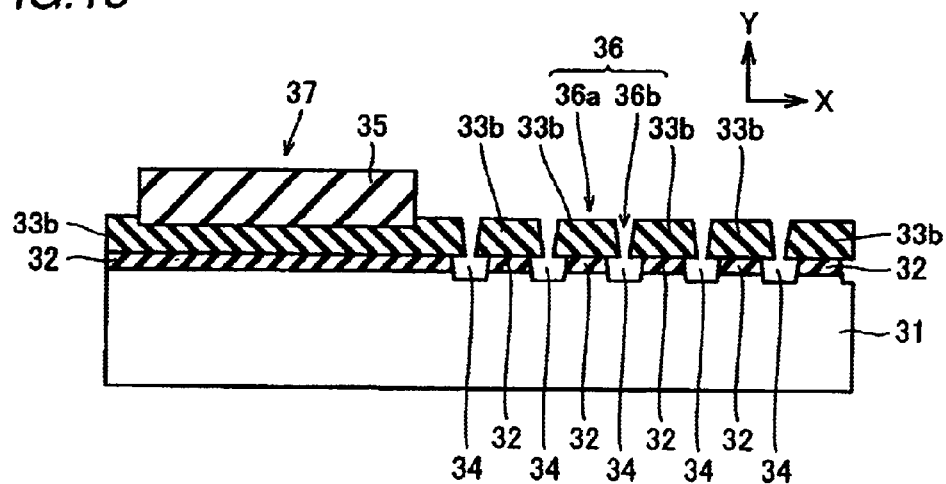

Then, GaN layers 33b are grown from the projection portions 33b of GaN on the first area 36, as shown in FIG. 18. In this case, growth of the GaN layers 33b along arrow X dominates following growth of the GaN layers 33b along arrow Y. Thus, the GaN layers 33b are further laterally grown above the recess portions 34.

Following the aforementioned lateral growth of the GaN layers 33b, dislocations in the GaN layers 33b are laterally bent along arrow X. Thus, the density of dislocations is uniformly reduced in the GaN layers 33b.

Figure 19:
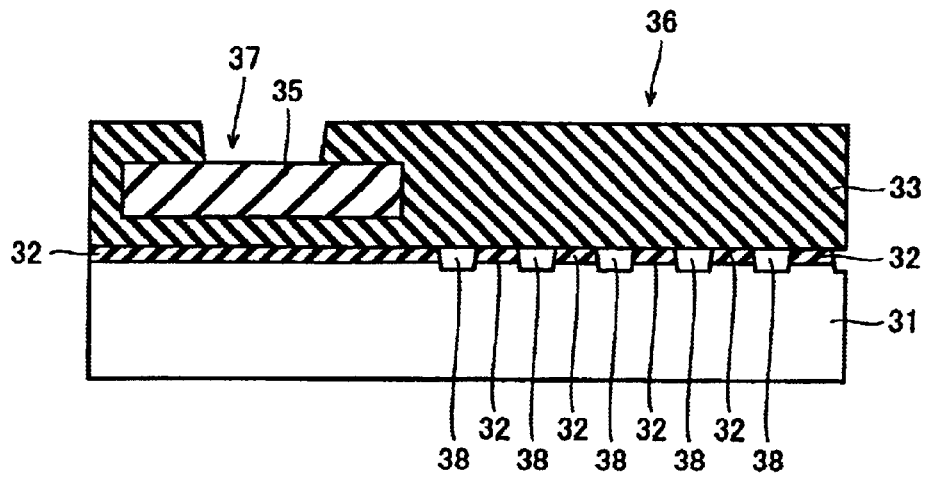

When the growth of the GaN layers 33b further progresses, a GaN layer 33 having a flattened upper surface is formed on the first area 36 with a thickness of about 10 μm, as shown in FIG. 19. Voids 38 are formed under the GaN layer 33 in the first area 36, as shown in FIG. 19. In this case, another GaN layer 33 is selectively laterally grown on the second area 37 through the mask layer 35 serving as a selective growth mask. However, no GaN layer 33 having a facet structure coalesces due to the large width W2 of the mask layer 35. Therefore, the second area 37 is provided with a region having no GaN layer 33.

According to the fourth embodiment, the GaN layer 33 having a large thickness is formed on the first area 36 while providing the region having no GaN layer 33 on the second area 37 as hereinabove described, whereby the second area 37 relaxes strain of the GaN layer 33 formed on the first area 36. Thus, the GaN layer 33 formed on the first area 36 can be effectively prevented from cracking and the degree of warpage of the substrate 31 can be reduced. Consequently, a nitride-based semiconductor element can be formed on the first area 36 with an excellent yield.

According to the fourth embodiment, the GaN layer 33 can be prevented from cracking and the substrate 31 can be prevented from warpage as described above, whereby an AlGaN layer, having a high Al composition, formed on the GaN layer 33 can be inhibited from cracking.

According to the fourth embodiment, further, the GaN layer 33 having excellent crystallinity can be formed as hereinabove described, whereby excellent crystallinity can be attained in a nitride-based semiconductor element, including a first area, formed on the GaN layer 33 and cracking can be prevented in a step of separation of the substrate into elements or the like. Thus, a nitride-based semiconductor element having excellent crystallinity and high reliability can be obtained.

Fifth Embodiment

Referring to FIGS. 20 to 24, a first area 46 and a second area 47 are recessed while the width of recess portions 45b in the second area 47 is set larger than the width of recess portions 45a in the first area 46 thereby growing GaN layers having a large thickness on the first area 46 while forming GaN layers having a small thickness on the second area 47 according to a fifth embodiment of the present invention. The fifth embodiment is now described in detail.

Figure 20:
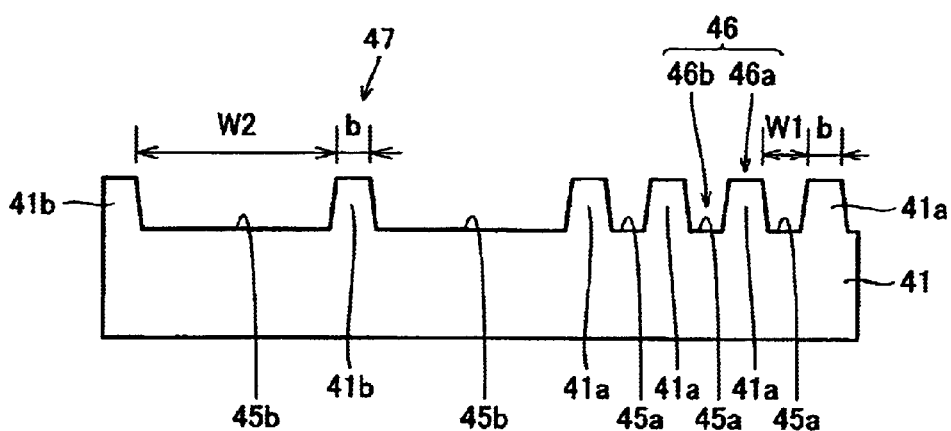
FIGS. 20 to 24 are sectional views for illustrating a method of forming a nitride-based semiconductor element according to a fifth embodiment of the present invention.

First, prescribed regions of a sapphire substrate 41 having a surface of the C-plane are etched by RIE or the like thereby forming the plurality of striped recess portions 45a and 45b extending in a prescribed direction, as shown in FIG. 20. In the first area 46, the width W1 of the recess portions 45a is preferably set to several μm to several 10 μm, and the width b of projection portions 41a is preferably set to several 100 nm to several 10 μm. The depth of the recess portions 45a is preferably set to several nm to several μm. According to the fifth embodiment, the width W1 of the recess portions 45a in the first area 46 is set to about 5 μm, the width b of the projection portions 41a is set to 2 μm and the depth of the recess portions 45a is set to about 1 μm, for example. According to the fifth embodiment, the side surfaces of the recess portions 45a are formed at a substantially perpendicular angle with respect to the C plane of the sapphire substrate 41.

The projection portions 41a of the first area 46 constitute second portions 46a easily allowing growth of GaN layers, and the recess portions 45a constitute first portions 46b having difficulty in allowing growth of GaN layers. The second and first portions 46a and 46b form the first area 46. The first area 46 is an example of the "first region" according to the present invention. The recess portions 45a are examples of the "third recess portion" according to the present invention, and the recess portions 45b are examples of the "fourth recess portion" according to the present invention.

The width of the recess portions 45b in the second area 47 is preferably set to at least several 10 μm, and the width b of the projection portions 41b is preferably set to several 100 nm to several 10 μm. The depth of the recess portions 45b is preferably set to several nm to several μm. According to the fifth embodiment, the width W2 of the recess portions 45b is set to about 100 μm, the width b of the projection portions 41b is set to about 2 μm, and the depth of the recess portions 45b is set to about 1 μm. The second area 47 is an example of the "second region" and the "third portion" according to the present invention.

The striped recess portions 45a and 45b are formed in the [1–100] direction. Alternatively, the striped recess portions 45a and 45b may be formed in the [11–20] direction, for example.

Figure 21:
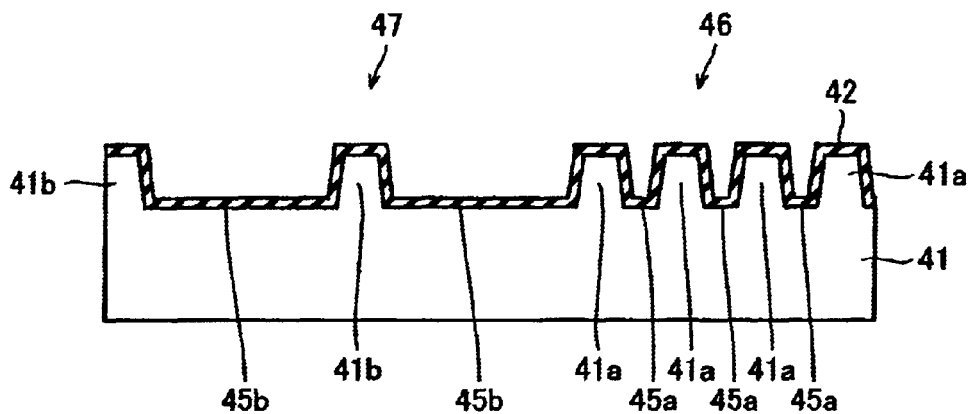

Then, an AlGaN buffer layer 42 of undoped AlGaN having a thickness of about 15 nm is grown on the upper surfaces of the projection portions 41a and 41b of the sapphire substrate 41, the bottom surfaces of the recess portions 45a and 45b and the side surfaces of the recess portions 45a and 45b by MOVPE while keeping the substrate temperature at 600° C., as shown in FIG. 21. In this case, the AlGaN buffer layer 42 is grown along arrows Y (c-axis direction) and X (lateral direction) on the upper surfaces of the projection portions 41a and 41b of the sapphire substrate 41 and the bottom surfaces of the recess portions 45a and 45b. The surface of the AlGaN buffer layer 42 formed in the aforementioned manner has recess and projection portions similar to the sapphire substrate 41.

Figure 22:
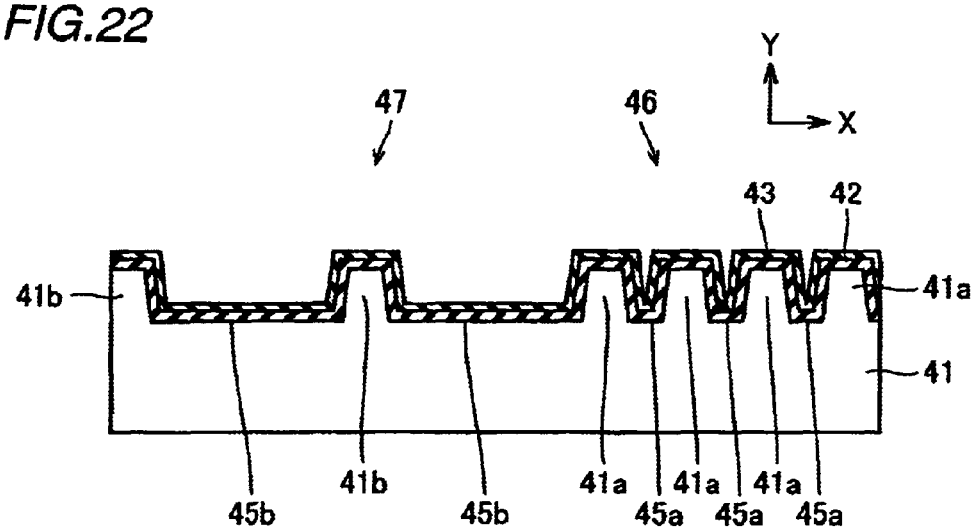

Then, a GaN layer 43 of undoped GaN is grown on the AlGaN buffer layer 42 by MOVPE while keeping the substrate temperature at 1150° C., as shown in FIG. 22. In this case, the GaN layer 43 is grown along arrow Y (c-axis direction) and thereafter grown also along arrow X (lateral direction) on the projection portions 41a and 41b of the sapphire substrate 41, on the recess portions 45a and 45b and on the side surfaces of the recess portions 45a and 45b in the initial stage of growth. The surface of the GaN layer 43 has recess and projection portions similar to the AlGaN buffer layer 42 in the initial stage of growth.

Figure 23:
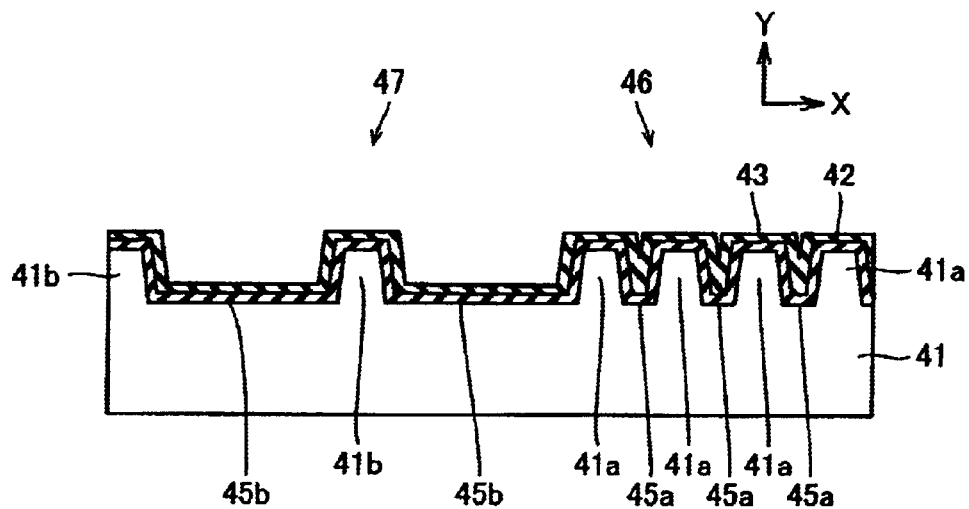

In the first area 46, growth of the GaN layer 43 along arrow X (lateral direction) dominates as the GaN layer 43 is grown along arrow Y, as shown in FIG. 23. In this case, portions of the GaN layer 43 located on the upper surfaces of the projection portions 41a and 41b and the side surfaces of the recess portions 45a are further laterally grown on portions located on the bottom surfaces of the recess portions 45a and 45b. Thus, the recess portions 45a are gradually filled up in the first area 46.

The GaN layer 43 is laterally grown on the first area 46 as described above, whereby dislocations formed in the vicinity of the sapphire substrate 41 and propagating along the c-axis direction are laterally bent along arrow X. Thus, the density of dislocations propagating along the c-axis direction is uniformly reduced in the GaN layer 43. More specifically, regions particularly reduced in dislocation density are formed on the recess portions 45a except the central portions (coalescent regions of the GaN layer 43) thereof.

Figure 24:
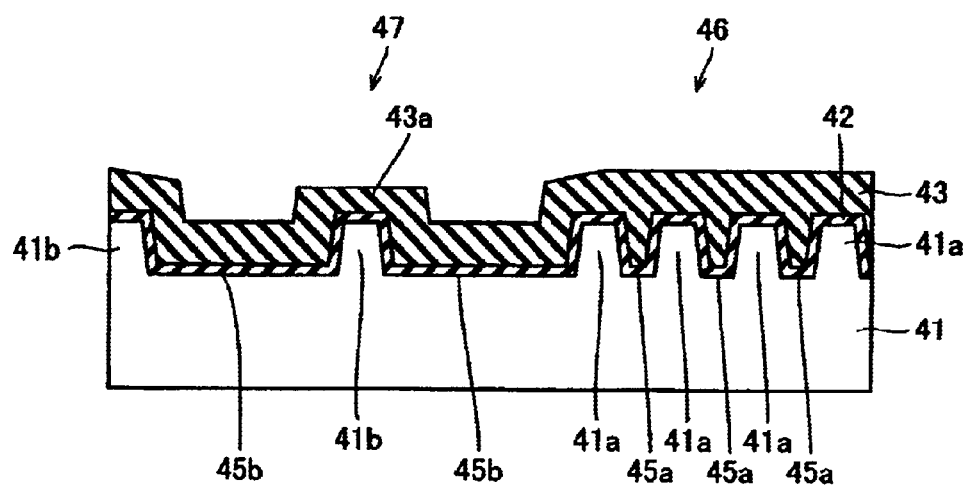

When the GaN layer 43 is further grown from the state shown in FIG. 23, the GaN layer 43 of about 10 μm in thickness having a flattened surface is formed on the first area 46, as shown in FIG. 24. The density of dislocations is reduced in the surface of the GaN layer 43 formed in the aforementioned manner, whereby excellent crystallinity can be attained.

In the second area 47, on the other hand, the width of the recess portions 45b is so large that the further grown GaN layer 43 is not flattened but a part 43a of the GaN layer 43 having a small thickness is formed.

According to the fifth embodiment, as hereinabove described, the sapphire substrate 41 formed with the striped recess portions 45a is employed so that the GaN layer 43 can be laterally grown without a selective growth mask. Thus, the density of dislocations can be reduced without employing the selective growth mask.

According to the fifth embodiment, further, the GaN layer 43 having a large thickness is formed on the first area 46 while the part 43a of the GaN layer 43 having a small thickness is formed on the second area 47, whereby strain of the GaN layer 43 easily concentrates to the part 43a having the small thickness on the second area 47. Thus, strain of the GaN layer 43 formed on the first area 46 is so relaxed that the GaN layer 43 of the first area 46 can be effectively prevented from cracking while the degree of warpage of the substrate 41 can be reduced. Consequently, a nitride-based semiconductor element can be formed on the first area 46 with a high yield.

According to the fifth embodiment, the GaN layer 43 is grown on the sapphire substrate 41 only once without providing an underlayer. Therefore, the GaN layer 43 having a small number of dislocations can be obtained through a small number of growing steps. Further, the overall thickness can be reduced.

According to the fifth embodiment, further, the GaN layer 43 is formed without a selective growth mask, whereby cracking resulting from difference between the thermal expansion coefficients of the selective growth mask and GaN can be prevented and the GaN layer 43 can be prevented from formation of voids.

According to the fifth embodiment, in addition, the GaN layer 43 having excellent crystallinity can be formed as hereinabove described. When a nitride-based semiconductor element layer including a first area is formed on the GaN layer 43, therefore, excellent crystallinity can be attained in the nitride-based semiconductor element layer and cracking can be prevented in a step of separation of the substrate into elements or the like. Thus, a nitride-based semiconductor element having excellent crystallinity and high reliability can be obtained.

Sixth Embodiment

Referring to FIGS. 25 to 29, recess portions 51b are formed on a first area 56 while recess portions 51d deeper than the recess portions 51b of the first area 56 are formed on a second area 57 thereby forming a GaN layer 53 having a large thickness on the first area 56 while forming a region 53a of the GaN layer 53 having a small thickness on the second area 57 in a sixth embodiment of the present invention. The sixth embodiment is now described in detail.

Figure 25:
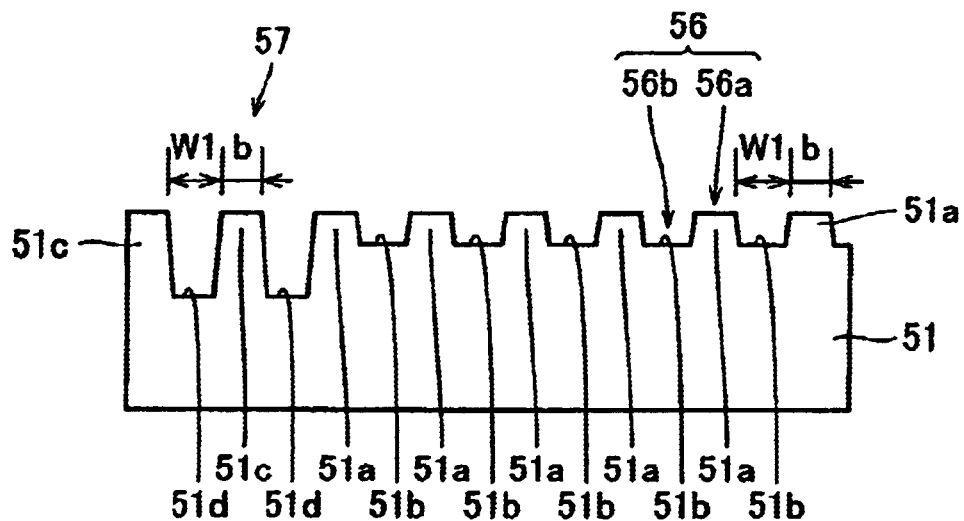
FIGS. 25 to 29 are sectional views for illustrating a method of forming a nitride-based semiconductor element according to a sixth embodiment of the present invention.

First, prescribed regions of a surface, defined by the (0001) plane, of an n-type 6H-SiC substrate 51 are etched by RIE or the like thereby forming the striped recess portions 51b and 51d, as shown in FIG. 25. The striped recess portions 51b are formed in the first area 56 to have a width of about 14 μm and a depth of about 1 μm and extend in the [11–20] direction. The striped recess portions 51d are formed in the second area 57 to have a width of about 14 μm and a depth of about 5 μm and extend in the [11–20] direction. Thus, the n-type 6H-SiC substrate 51 having the striped recess portions 51b and 51d on its surface is prepared.

In the first area 56, projection portions 51a constitute second portions 56a easily allowing growth of the GaN layer 53, and the recess portions 51b constitute first portions 56b having difficulty in allowing growth of the GaN layer 53. The second and first portions 56a and 56b form the first area 56. The recess portions 51b are examples of the "first recess portion" according to the present invention, and the recess portions 51d are examples of the "second recess portion" according to the present invention. The first area 56 is an example of the "first region" according to the present invention. The second area 57 is an example of the "second region" and the "third portion" according to the present invention.

Figure 26:
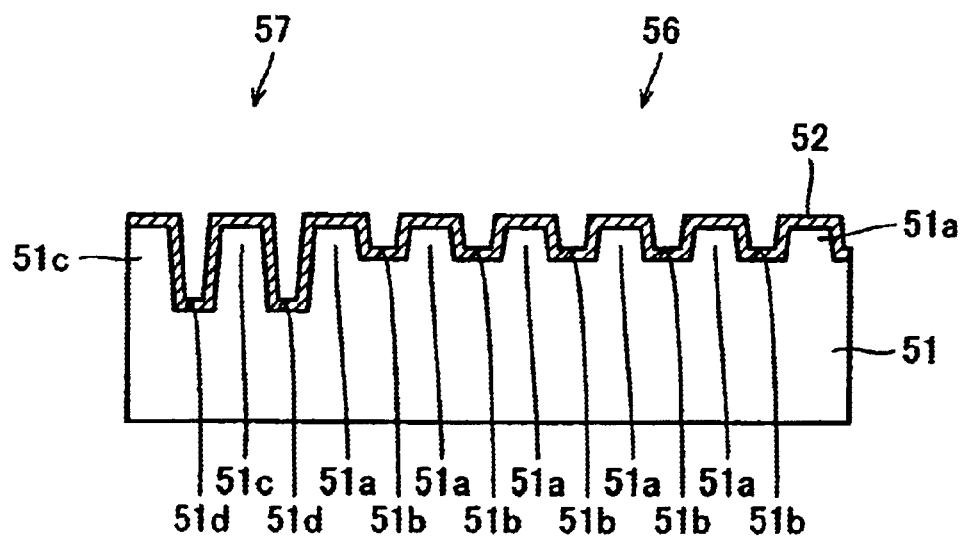

As shown in FIG. 26, a single-crystalline AlGaN buffer layer 52 of n-type $Al_{0.09}Ga_{0.91}N$ having a thickness of about 0.05 μm is formed on the n-type 6H-SiC substrate 51 by MOVPE while keeping the substrate temperature at 1150° C.

Figure 27:
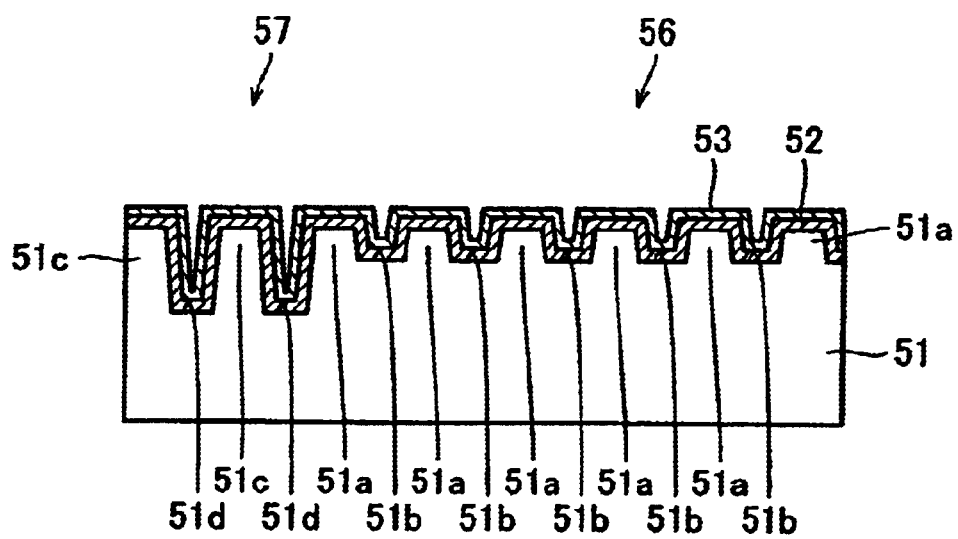
Figure 28:
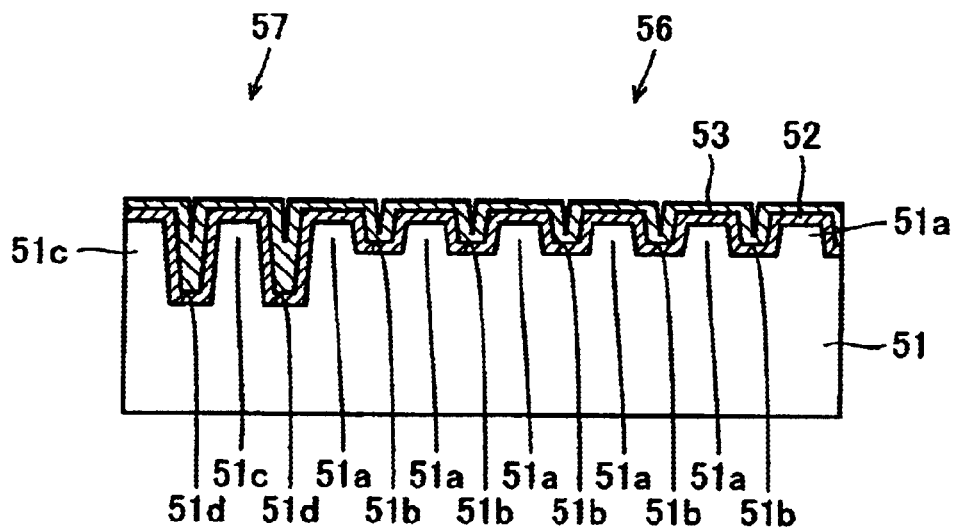

As shown in FIG. 27, the n-type GaN layer 53 is grown on the AlGaN buffer layer 52 by MOVPE while keeping the substrate temperature at 1150° C.

Figure 29:
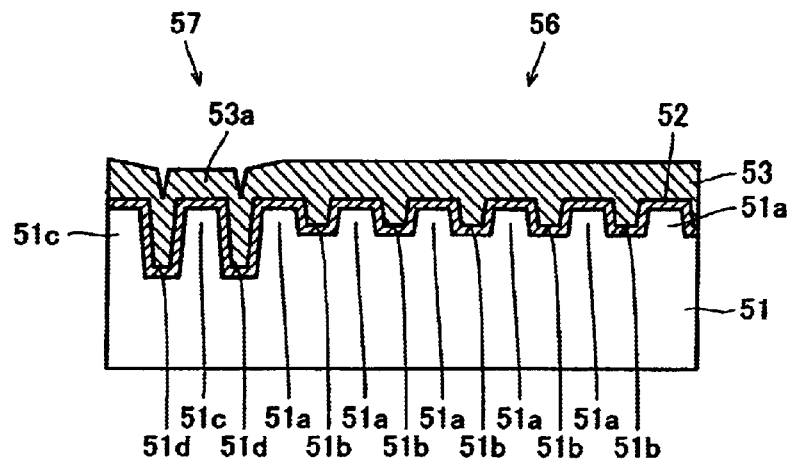

When the GaN layer 53 is grown as described above, lateral growth dominates after vertical growth. The GaN layer 53 is formed to have a flattened surface and a thickness of about 10 μm in the first area 56 as shown in FIG. 29 through a form shown in FIG. 28. However, the upper surface of a portion of the GaN layer 53 located on the second area 57 is not flattened due to the deep recess portions 51d. Therefore, the region 53a having a small thickness is formed on the second area 57.

According to the sixth embodiment, the GaN layer 53 can be laterally grown on the first area 56 through the recess portions 51b without employing a selective growth mask, whereby inconvenience such as cracking resulting from difference between the lattice constants of the selective growth mask and GaN can be prevented.

Further, the thick GaN layer 53 is formed on the first area 56 while forming the region 53a of the GaN layer 53 having a small thickness on the second area 57, whereby strain of the GaN layer 53 easily concentrates to the region 53a having a small thickness. Thus, strain of the GaN layer 53 can be relaxed in the first area 56, whereby the GaN layer 53 can be effectively prevented from cracking and the substrate 56 can be prevented from warpage.

Seventh Embodiment

Referring to FIGS. 30 to 33, mask layers 62a formed on a first area 66 are reduced in thickness and mask layers 62b formed on a second area 67 are increased in thickness thereby increasing the thickness of a GaN layer 64 in the first area 66 and forming regions 64a of the GaN layer 64 having a small thickness on the second area 67 according to a seventh embodiment of the present invention. The seventh embodiment is now described in detail.

Figure 30:
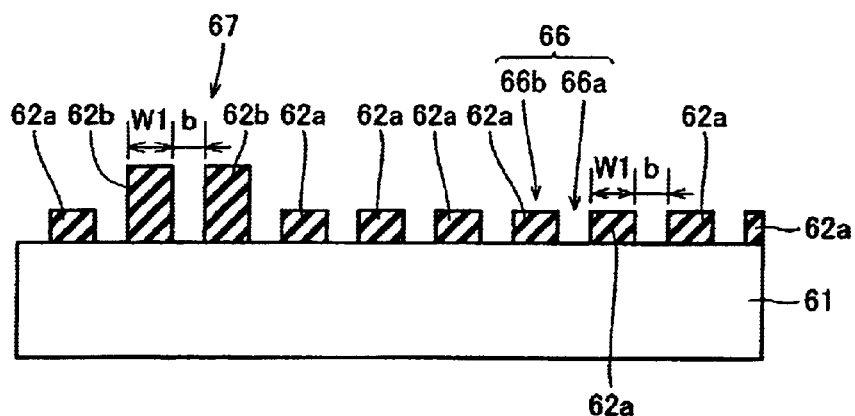

As shown in FIG. 30, the mask layers 62a and 62b of SiN are formed on the surface of an n-type GaAs (111) substrate 61 (hereinafter referred to as "n-type GaAs substrate 61") at prescribed intervals. The mask layers 62a are formed on the first area 66 with a thickness of about 10 nm to about 50 nm and a width W1 of about 5 μm. The mask layers 62b are formed on the second area 67 with a thickness of about 200 nm to about 1000 nm and the width W1 of about 5 μm. The interval b between the mask layers 62a and between the mask layers 62b is set to about 2 μm.

Portions of the n-type GaAs substrate 61 exposed on the first area 66 constitute second portions 66a easily allowing growth of the GaN layer 64. Portions formed with the mask layers 62a constitute first portions 66b having difficulty in allowing growth of the GaN layer 64. The second and first portions 66a and 66b form the first area 66. The first area 66 is an example of the "first region" according to the present invention. The mask layers 62a are examples of the "third mask layer" according to the present invention, and the mask layers 62b are examples of the "fourth mask layer" according to the present invention. The second area 67 is an example of the "second region" and the "third portion" according to the present invention.

Figure 31:
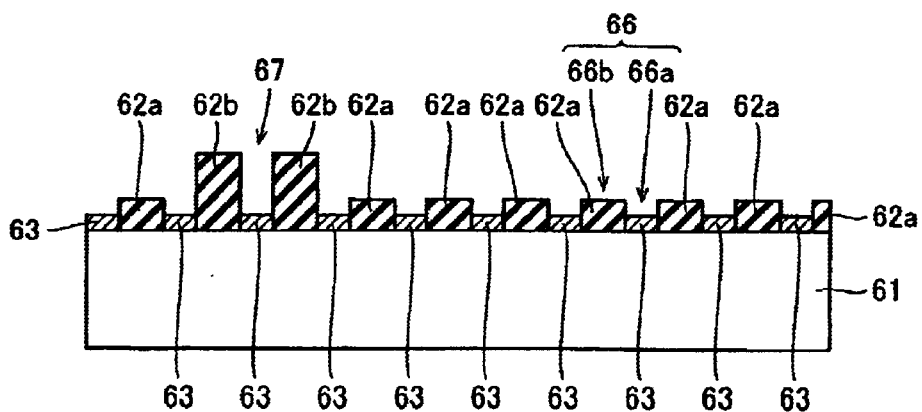

As shown in FIG. 31, low-temperature buffer layers 63 of n-type AlGaN or n-type GaN having a thickness of about 10 nm to about 50 nm are formed on the exposed surface portions of the n-type GaAs substrate 61 under a temperature condition of about 500° C. to about 700° C.

As shown in FIG. 32, n-type GaN layers 64 are selectively laterally grown on the low-temperature buffer layers 63 by MOVPE or HVPE through the mask layers 62a and 62b serving as selective growth masks.

When further grown from the form shown in FIG. 32, the GaN layers 64 having a facet structure coalesce with each other to form the continuous n-type GaN layer 64 of about 10 μm in thickness having a flattened upper surface, as shown in FIG. 33. The density of dislocations is reduced in the surface of the n-type GaN layer 64, whereby excellent crystallinity can be attained.

In the second area 67, the n-type GaN layers 64 having a facet structure only partially coalesce with each other following further growth due to the large thickness of the mask layers 62b, to constitute the regions 64a having a small thickness. Strain of the GaN layer 64 concentrates to the regions 64a of the GaN layer 64 having a small thickness, whereby strain of the GaN layer 64 is relaxed in the first area 66. Thus, the GaN layer 64 can be effectively prevented from cracking in the first area 66, and the degree of warpage of the substrate 61 can be reduced. Consequently, a nitride-based semiconductor element can be formed on the first area 66 with an excellent yield.

According to the seventh embodiment, the GaN layer 64 having excellent crystallinity can be so formed that a nitride-based semiconductor element including a first area is formed thereon to attain excellent crystallinity while preventing cracking in a step of separation of the substrate into elements or the like. Thus, a nitride-based semiconductor element having excellent crystallinity and high reliability can be obtained.

Eighth Embodiment

Referring to FIGS. 34 to 39, GaN layers 74 having a large thickness are formed on first areas 76 while forming regions having no GaN layers on second areas 77 through a plurality of mask layers 72 according to an eighth embodiment of the present invention. The eighth embodiment is now described in detail.

Figure 35:
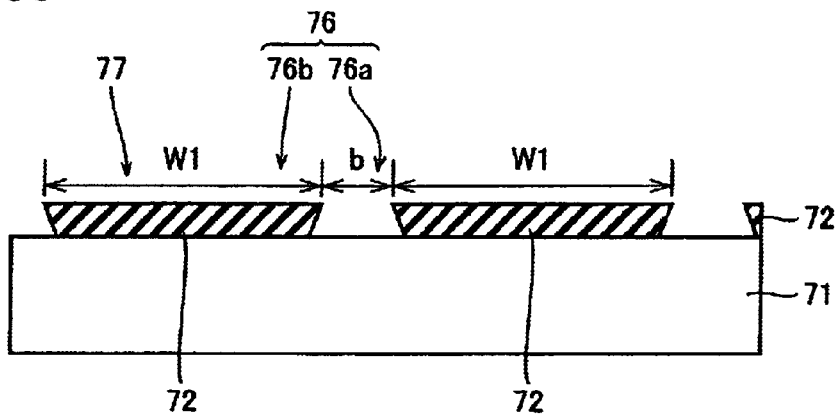

First, an SiN layer 72 is formed on a sapphire substrate 71, as shown in FIG. 34. Prescribed regions of the SiN layer 72 are removed thereby forming the inverse mesa (inverse trapezoidal) mask layers 72 of SiN having overhangs, as shown in FIG. 35. The interval b between the mask layers 72b is 2 μm. The width W1 of the mask layers 72 is obtained by subtracting the interval b (2 μm) from the pitch (e.g., 700 μm) of the first areas 76.

Figure 36:
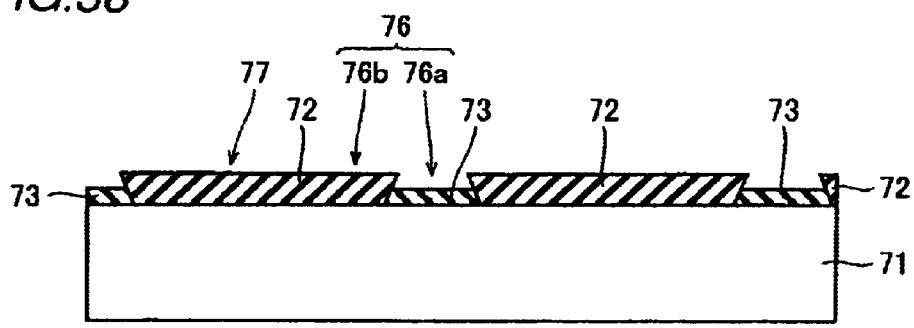

As shown in FIG. 36, low-temperature buffer layers 73 of AlGaN are formed on surface portions of the sapphire substrate 71 exposed between the mask layers 72.

Figure 37:
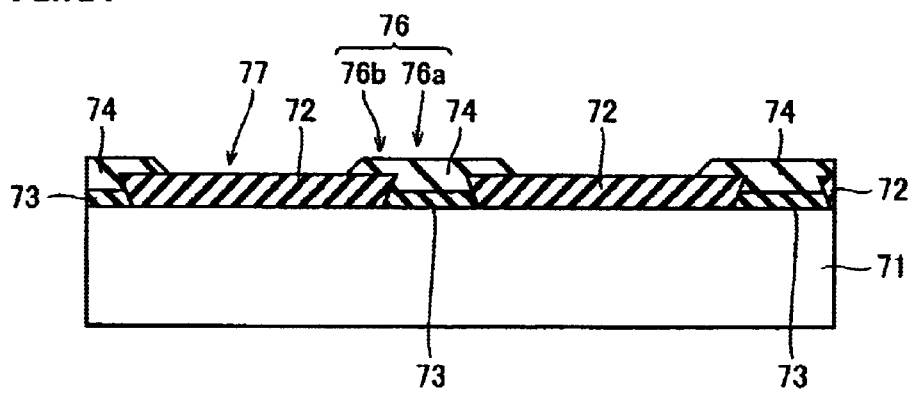
Figure 38:
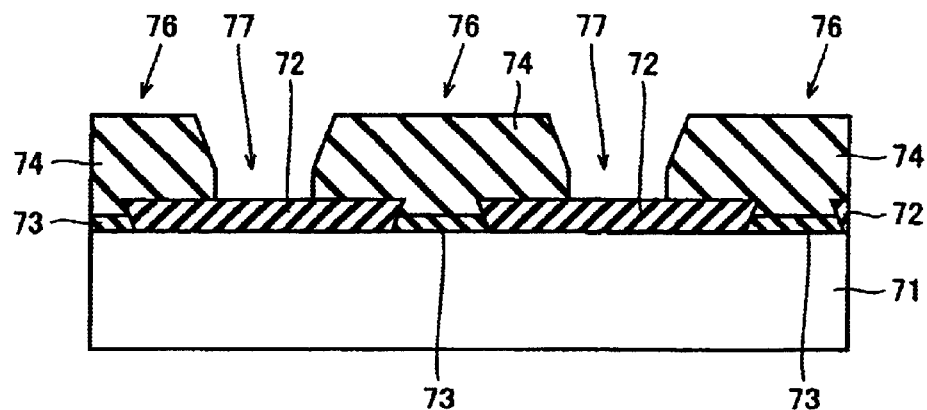

As shown in FIG. 37, the GaN layers 74 are selectively laterally grown on the low-temperature buffer layers 73 through the mask layers 72 serving as selective growth masks. When the GaN layers 74 are further selectively laterally grown from the state shown in FIG. 37, GaN layers 74 of about 10 μm in thickness having flat surfaces are formed on the first areas 76 while the regions having no GaN layers 74 are formed on the second areas 77 due to the large thickness of the mask layers 72.

The first areas 76 include second portions 76a, located on regions formed with the low-temperature buffer layers 73, easily allowing growth of the GaN layers 74 and first portions 76b, located on ends of the mask layers 72, having difficulty in allowing growth of the GaN layers 74. The first areas 76 are examples of the "first region" according to the present invention, and the second areas 77 are examples of the "second region" and the "third portion" according to the present invention.

Figure 39:
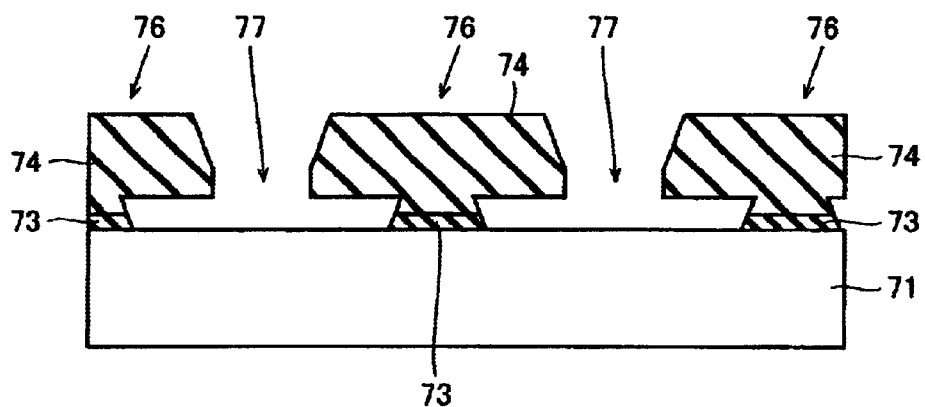

Thereafter the mask layers 72 are removed thereby obtaining a shape shown in FIG. 39.

According to the eighth embodiment, as hereinabove described, the GaN layers 74 are selectively laterally grown through the plurality of wide mask layers 72, so that the GaN layers 74 having a large thickness can be formed on the first areas 76 while forming the regions having no GaN layers 74 on the second areas 77. The regions having no GaN layers 74 are so formed on the second areas 77 as to relax strain of the GaN layers 74 in the first areas 76, whereby the GaN layers 74 formed on the first areas 76 can be effectively prevented from cracking and the degree of warpage of the substrate 71 can be reduced. Consequently, nitride-based semiconductor elements can be formed on the first areas 76 with an excellent yield.

According to the eighth embodiment, the GaN layers 74 having excellent crystallinity can be so formed that nitride-based semiconductor elements including first areas are formed thereon to attain excellent crystallinity while preventing cracking in a step of separation of the substrate into elements or the like. Thus, nitride-based semiconductor elements having excellent crystallinity and high reliability can be obtained.

Ninth Embodiment

Referring to FIGS. 40 to 44, mask layers 84 having a large width are formed on an underlayer of GaN for thereafter selectively laterally growing GaN layers 85 through the mask layers 84 thereby forming GaN layers 85 having a large thickness on first areas 86 while forming regions having no GaN layers 84 on second areas 87 in a ninth embodiment of the present invention, dissimilarly to the aforementioned eighth embodiment. The ninth embodiment is now described in detail.

Figure 40:
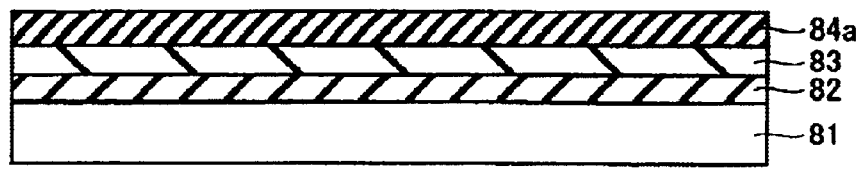
FIGS. 40 to 44 are sectional views for illustrating a method of forming a nitride-based semiconductor element according to a ninth embodiment of the present invention.
Figure 41:
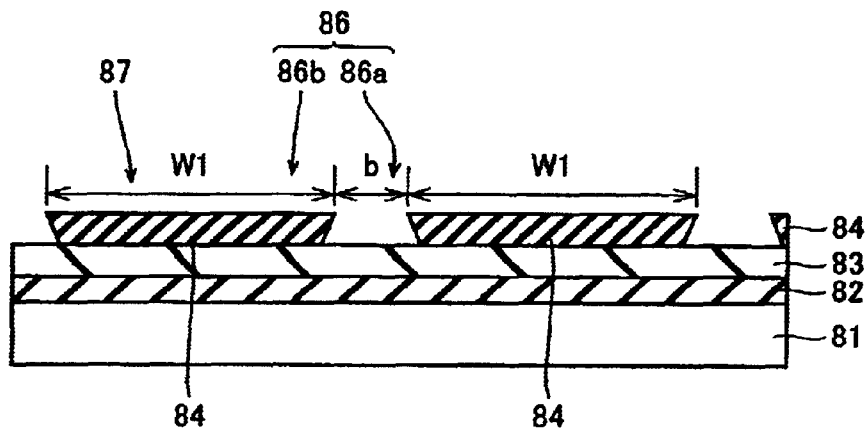

As shown in FIG. 40, a GaN layer 83 serving as the underlayer is formed on a sapphire substrate 81 through a buffer layer 82. An SiN layer 84a is formed on the GaN layer 83. Prescribed regions of the SiN layer 84a are removed thereby forming the wide inverse mesa (inverse trapezoidal) mask layers 84 having overhangs of SiN, as shown in FIG. 41. The interval b between the mask layers 84 is 2 μm. The width W1 of the mask layers 84 is obtained by subtracting the interval b (2 μm) from the pitch (e.g., 700 μm) of the first areas 86.

Figure 42:
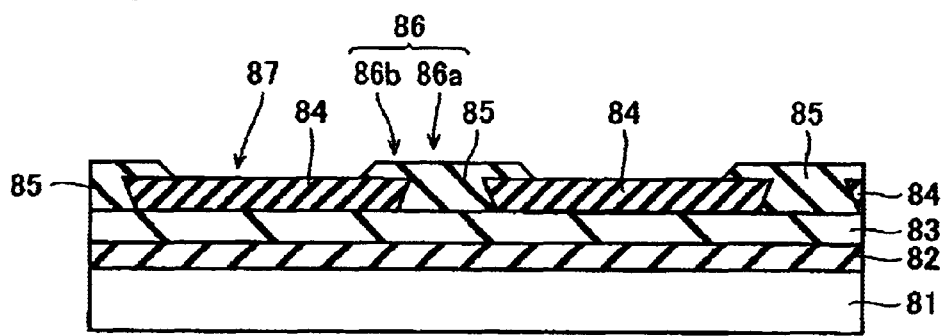
Figure 43:
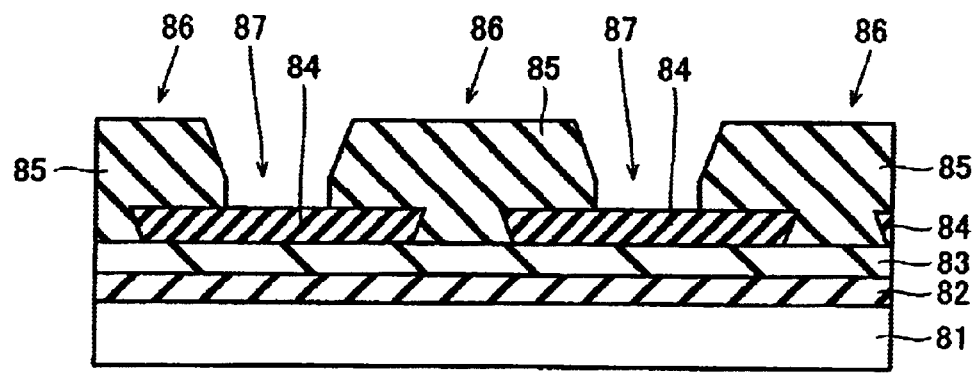

As shown in FIG. 42, the GaN layers 85 are selectively laterally grown on the GaN layer 83 serving as the underlayer through the mask layers 84 serving as selective growth masks. When the GaN layers 85 are further grown from the state shown in FIG. 42, GaN layers 85 of about 10 μm in thickness having flat upper surfaces are formed on the first areas 86 while the second areas 87 are formed with the regions having no GaN layers 85 due to the large thickness of the mask layers 84, as shown in FIG. 43.

The first areas 86 include second portions 86a, located on exposed upper surface portions of the GaN layer 83, easily allowing growth of the GaN layers 85 and first portions 86b, located on ends of the mask layers 84, having difficulty in allowing growth of the GaN layers 85. The first areas 86 are examples of the "first region" according to the present invention, and the second areas 87 are examples of the "second region" and the "third portion" according to the present invention.

Figure 44:
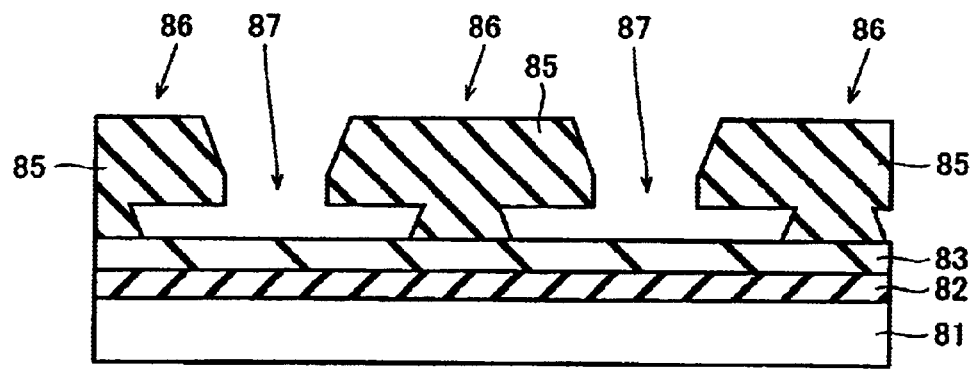

Thereafter the mask layers 84 are removed, thereby obtaining a shape shown in FIG. 44.

According to the ninth embodiment, the thick GaN layers 85 can be formed on the first areas 86 while the regions having no GaN layers 85 can be formed on the second areas 87 as hereinabove described, whereby strain of the GaN layers 85 of the first areas 86 is relaxed by the regions having no GaN layers 85 in the second areas 87. Thus, the GaN layers 85 of the first areas 86 can be effectively prevented from cracking, and the degree of warpage of the substrate 81 can be reduced. Consequently, nitride-based semiconductor elements can be formed on the first areas 86 with an excellent yield.

According to the ninth embodiment, the GaN layers 85 having excellent crystallinity can be so formed that nitride-based semiconductor elements including first areas are formed thereon to attain excellent crystallinity while preventing cracking in a step of separation of the substrate into elements or the like. Thus, nitride-based semiconductor elements having excellent crystallinity and high reliability can be obtained.

Tenth Embodiment

Figure 45:
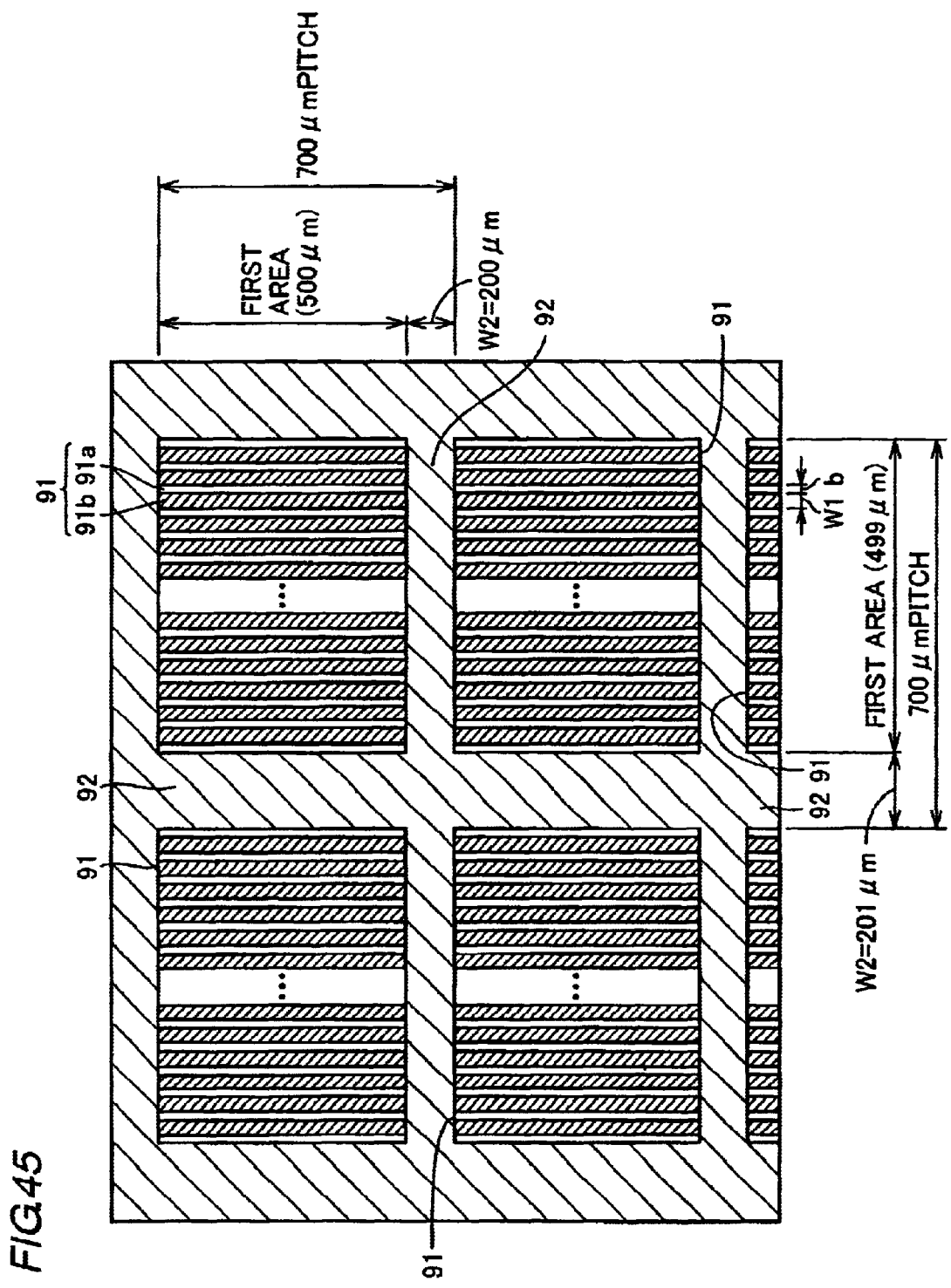
FIG. 45 illustrates a plane layout of first areas provided with nitride-based semiconductor elements and second areas according to a tenth embodiment of the present invention.

As shown in FIG. 45, second areas 92 are provided in the form of a lattice to enclose rectangular first areas 91 according to a tenth embodiment of the present invention. The first areas 91 are examples of the "first region" according to the present invention, and the second areas 92 are examples of the "second region" and the "third portion" according to the present invention. The second areas 92 are formed with regions having no GaN layers or regions having thin portions of GaN layers, similarly to any of the aforementioned first to ninth embodiments. The rectangular first areas 91 are formed with second portions 91a easily allowing growth of GaN layers and first portions 91b having difficulty in allowing growth of GaN layers. The second portions 91a easily allowing growth of GaN layers include regions formed with buffer layers, regions formed with projection portions or regions formed with no mask layers. The first portions 91b having difficulty in allowing growth of GaN layers include regions formed with mask layers, regions formed with no buffer layers or regions formed with recess portions.

The width b of the second portions 91a easily allowing growth of GaN layers is about 2 μm, and the width W1 of the first portions 91b having difficulty in allowing growth of GaN layers is about 5 μm. The width of the first areas 91 perpendicular to stripes is 499 μm, and the width W2 of the second areas 92 perpendicular to the stripes is 201 μm. Thus, the first areas 91 are formed at a pitch of 499 μm+201 μm=700 μm in the direction perpendicular to the stripes. The width of the first areas 91 parallel to the stripes is 500 μm, and the width of the second areas 92 parallel to the stripes is 200 μm. Thus, the first areas 91 are formed at a pitch of 500 μm+200 μm=700 μm in the direction parallel to the stripes.

Figure 46:
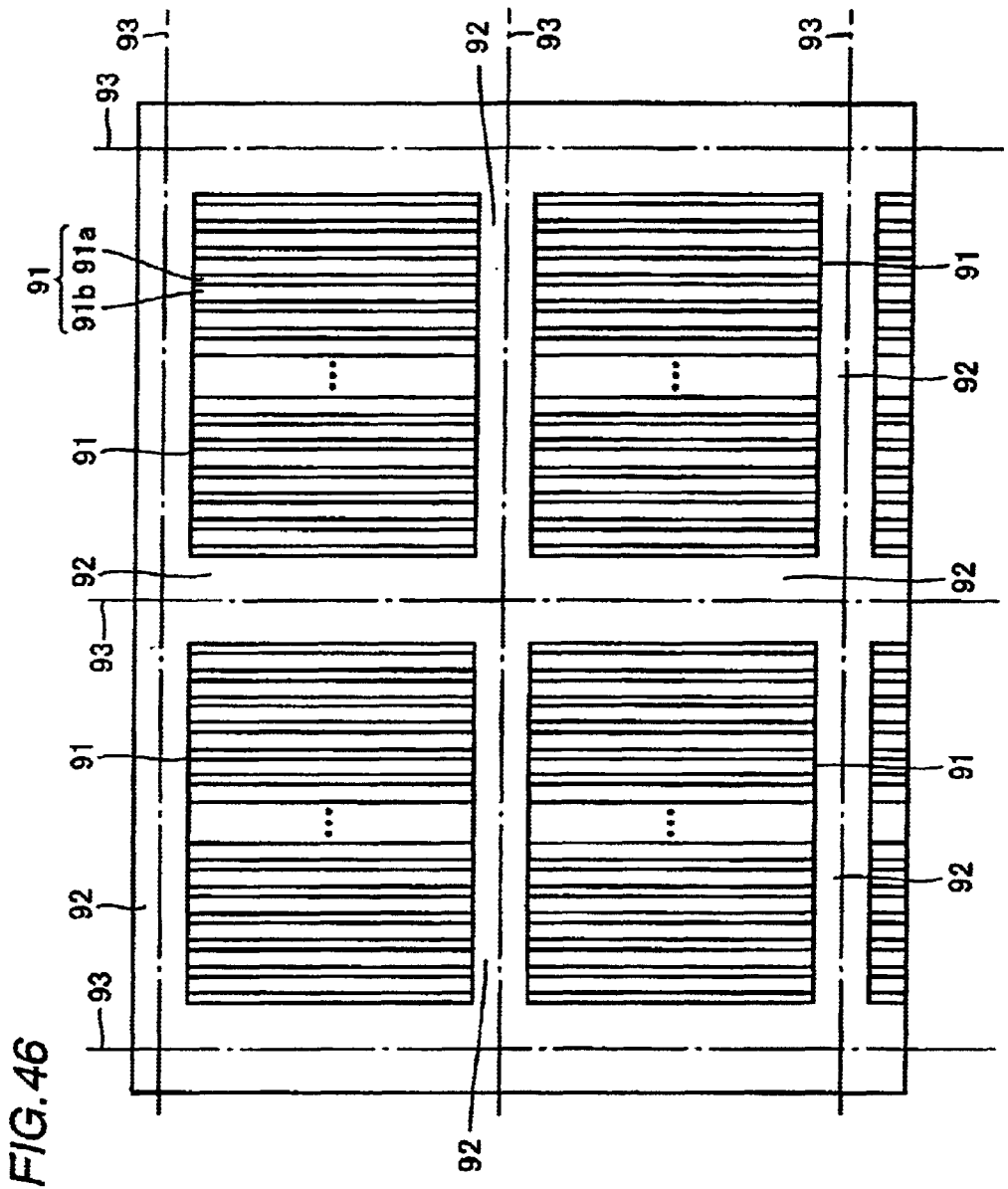
FIG. 46 is a plane layout diagram for illustrating separation of the substrate into each element portions for forming light-emitting diode devices in the plane layout of the tenth embodiment shown in FIG. 45.

Light-emitting diode (LED) devices are formed on the first areas 91 and thereafter separated into respective LED chips along one-dot chain lines 93 shown in FIG. 46. In this case, the regions having no GaN layers or the regions having thin portions of GaN layers are formed only on the peripheral portions (portions corresponding to the second areas 92) of the LED chips, whereby the areas of the light-emitting diode devices can be increased. Thus, luminous intensity can be increased.

Figure 47:
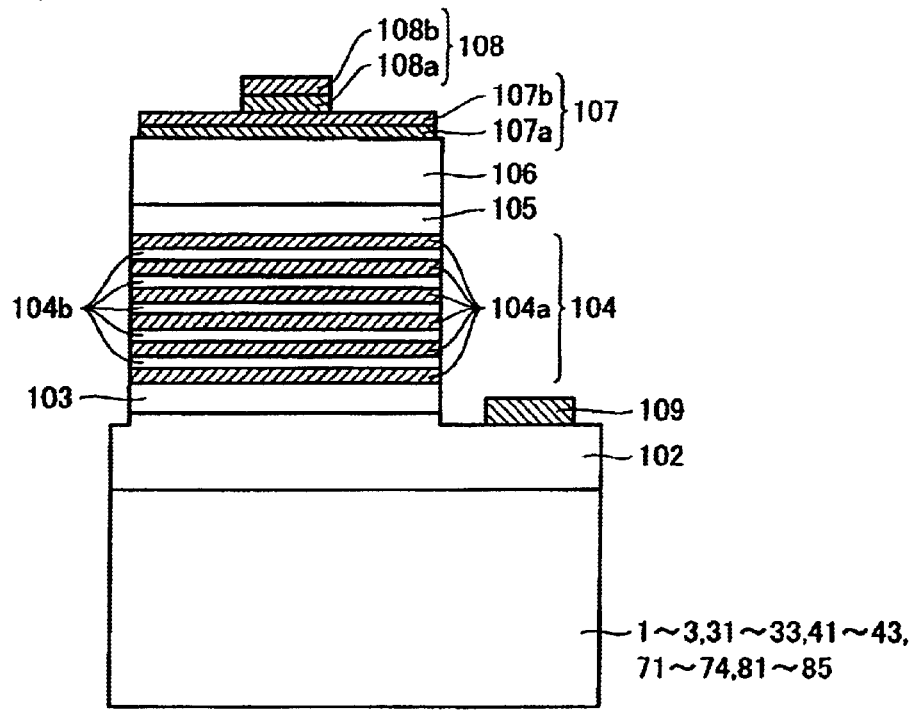
FIG. 47 is a sectional view showing an exemplary structure of a light-emitting diode device formed according to the tenth embodiment shown in FIGS. 45 and 46.

An exemplary structure of a light-emitting diode device according to the tenth embodiment is described with reference to FIG. 47. An insulator substrate such as the sapphire substrate employed in the first, fourth, fifth, eighth or ninth embodiment is employed for the light-emitting diode device shown in FIG. 47. According to this structure, an n-type contact layer 102 of Si-doped GaN having a thickness of about 5 μm is formed on a GaN layer similar to that formed in the first, fourth, fifth, eighth or ninth embodiment. An n-type cladding layer 103 of Si-doped $Al_{0.2}Ga_{0.8}N$ having a thickness of about 0.15 μm is formed on the n-type contact layer 102.

Six barrier layers 104 of undoped $Al_{0.1}Ga_{0.9}N$ each having a thickness of 5 nm and five well layers 104b of undoped GaN each having a thickness of 5 nm are alternately stacked on the n-type cladding layer 103, thereby forming an emission layer 104 consisting of multiple quantum wells (MQW). A p-type cladding layer 105 of Mg-doped $Al_{0.2}Ga_{0.8}N$ having a thickness of about 0.15 μm is formed on the emission layer 104. A p-type contact layer 106 of Mg-doped GaN having a thickness of about 0.3 μm and carrier concentration of about $2 \times 10^{-8}$ $cm^{-3}$ is formed on the p-type cladding layer 105.

Regions of the layers from the p-type contact layer 106 to a prescribed position of the n-type contact layer 102 are partially removed thereby exposing a partial region of the n-type contact layer 102. A p-side optically transparent electrode 107 consisting of a Pd film 107a having a thickness of about 20 nm and an Au film 107b having a thickness of about 40 nm is formed on the upper surface of the p-type contact layer 106. A p-side pad electrode 108 consisting of a Ti film 108a having a thickness of about 30 nm and an Au film 108b having a thickness of about 500 nm is formed on a prescribed region of the p-side optically transparent electrode 107. An n-side electrode 109 consisting of an Al film having a thickness of about 500 nm is formed on the exposed region of the n-type contact layer 102.

Figure 48:
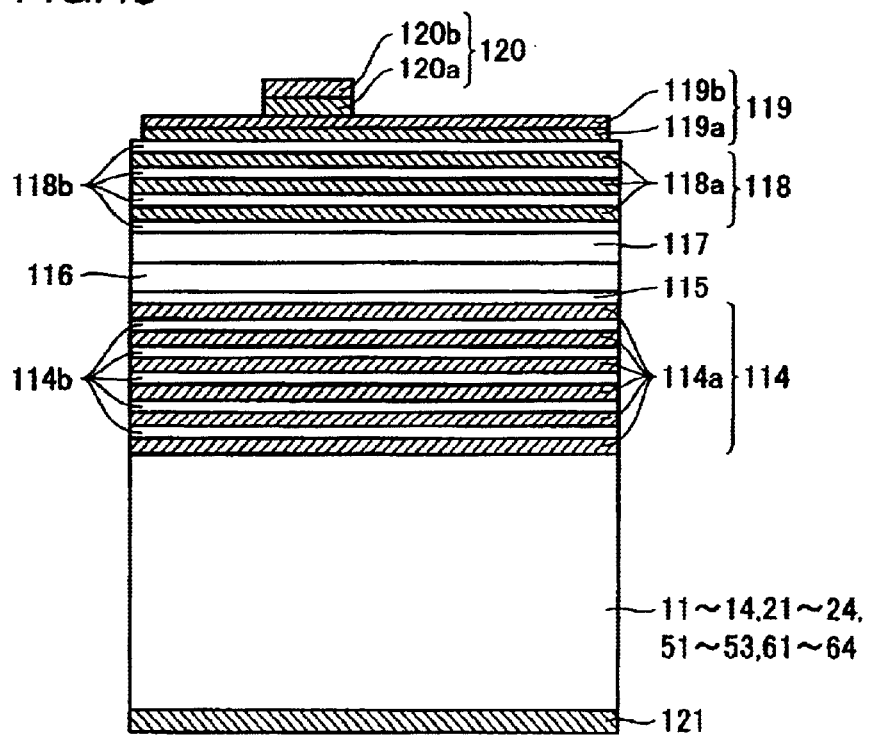
FIG. 48 is a sectional view showing another exemplary structure of the light-emitting diode device formed according to the tenth embodiment shown in FIGS. 45 and 46.

Another exemplary light-emitting diode device formed according to the tenth embodiment is now described with reference to FIG. 48. A conductive substrate such as the Si substrate employed in the second, third, sixth or seventh embodiment is employed for this light-emitting diode device. In this light-emitting diode device, six barrier layers 114a of undoped GaN each having a thickness of 5 nm and five well layers 114b of undoped $Ga_{0.65}In_{0.35}N$ each having a thickness of 5 nm are alternately stacked on an n-type GaN layer similar to that grown in the second, third, sixth or seventh embodiment thereby forming an emission layer 114 consisting of multiple quantum wells (MQW).

A protective layer 115 of undoped GaN having a thickness of about 10 nm is formed on the emission layer 114 for preventing the emission layer 114 from crystal deterioration. A p-type cladding layer 116 of Mg-doped $Al_{0.05}Ga_{0.95}N$ having a thickness of about 0.15 μm and a p-type intermediate layer 117 of Mg-doped GaN having a thickness of about 0.3 μm are successively formed on the protective layer 115. Fourteen Mg-doped GaN layers 118 having doping concentration of about $1 \times 10^{19}$ $cm^{-3}$, each having a thickness of about 10 nm, and 15 undoped $Ga_{0.7}In_{0.3}N$ layers 118a each having a thickness of about 10 nm are alternately stacked on the p-type intermediate layer 117, for forming a p-type contact layer 118 consisting of a superlattice structure. FIG. 48 shows only four Mg-doped GaN layers 118b and three undoped $Ga_{0.7}In_{0.3}N$ layers 118a, in order to simplify illustration. The $Ga_{0.7}In_{0.3}N$ layers 118a may alternatively be doped with Mg.

A p-side transparent electrode 119 formed by a Pd film 119a having a thickness of about 20 nm and an Au film 119b having a thickness of about 40 nm is provided on the upper surface of the p-type contact layer 118. A p-side pad electrode 120 consisting of a Ti film 120a having a thickness of about 30 nm and an Au film 120b having a thickness of about 500 nm is formed on a partial region of the p-side transparent electrode 119. An n-side electrode 121 consisting of an Au film having a thickness of about 600 nm is formed on the back surface of the conductive substrate.

Eleventh Embodiment

Figure 49:
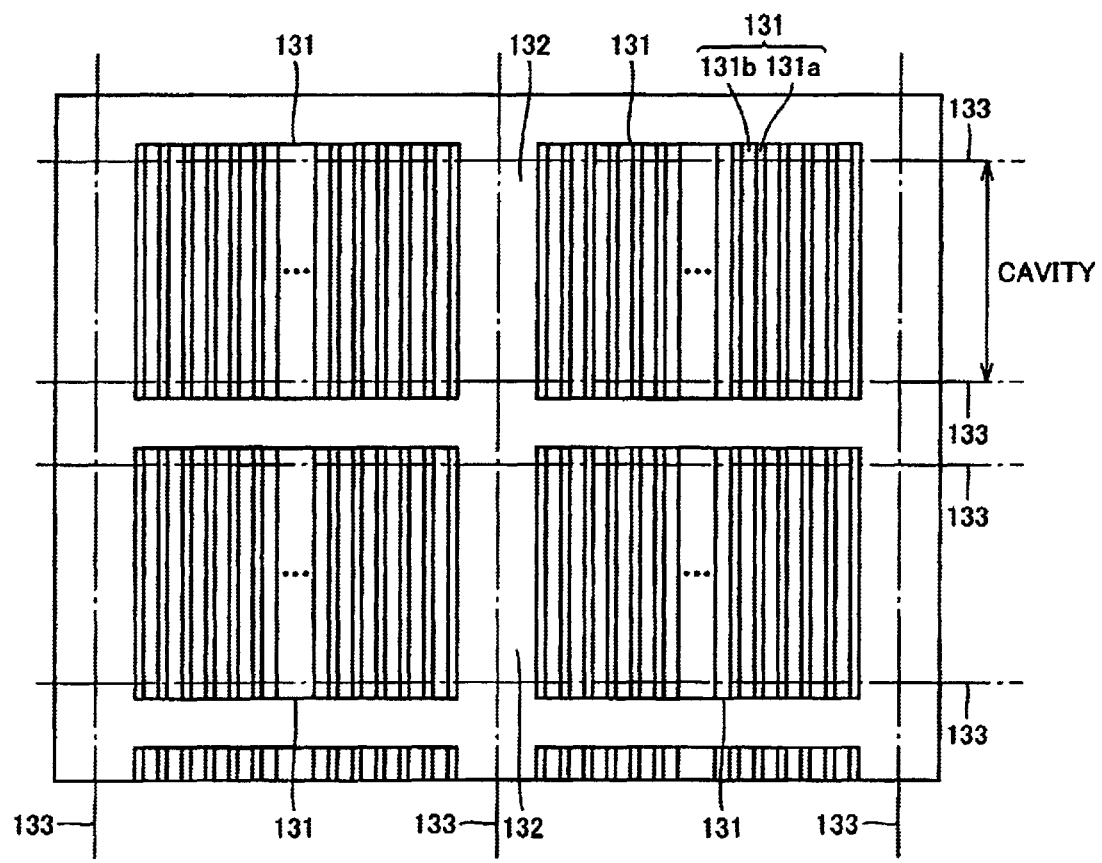
FIG. 49 illustrates a plane layout of first areas provided with nitride-based semiconductor elements, second areas and separation of the substrate into each element portions according to an eleventh embodiment of the present invention.

As shown in FIG. 49, second areas 132 are provided in the form of a lattice to enclose first areas 131 also according to an eleventh embodiment of the present invention. The first areas 131 are examples of the "first region" according to the present invention, and the second areas 132 are examples of the "second region" and the "third portion" according to the present invention. The second areas 132 are formed with regions having no GaN layers grown on the first areas 131 or regions having GaN layers formed in a small thickness. The first areas 131 are formed with second portions 131a easily allowing growth of the GaN layers and first portions 131b having difficulty in allowing growth of the GaN layers.

Nitride-based semiconductor laser devices are formed on the first areas 131 and thereafter divided along isolation lines 133 to be separated into laser chips. In this case, cavity surfaces are formed by cleavage along the isolation line 133 perpendicular to stripes of the laser devices.

Figure 50:
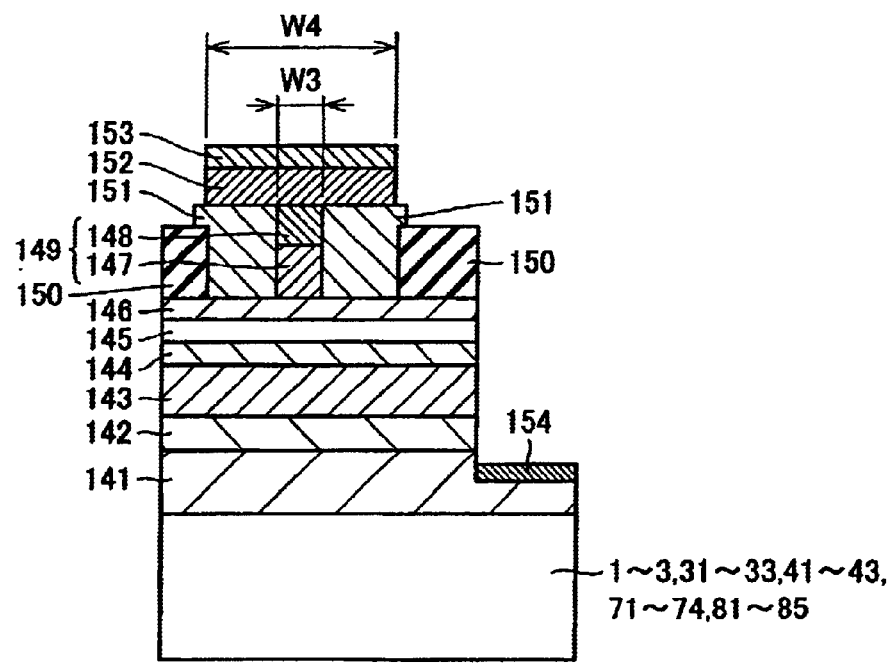
FIG. 50 is a sectional view showing an exemplary structure of a nitride-based semiconductor laser device formed on each first area according to the eleventh embodiment shown in FIG. 49.

An exemplary structure of a nitride-based semiconductor laser device formed in the aforementioned manner is described with reference to FIG. 50. An insulating substrate such as the sapphire substrate employed in the first, fourth, fifth, eighth or ninth embodiment is employed for this nitride-based semiconductor laser device.

In this nitride-based semiconductor laser device, an n-type contact layer 141 of n-type GaN provided with a mesa portion of about 70 μm and having a thickness of about 4 μm is formed on a GaN layer similar to that grown in the first, fourth, fifth, eighth or ninth embodiment. An anti-cracking layer 142 of n-type $Ga_{0.95}In_{0.05}N$ having a thickness of about 0.1 μm, an n-type second cladding layer 143 of Si-doped $Al_{0.3}Ga_{0.7}N$ having a thickness of about 1 μm, an n-type first cladding layer 144 of Si-doped GaN having a thickness of about 50 nm and an MQW emission layer 145 consisting of multiple quantum wells (MQW) of GaInN are formed on the upper surface of the mesa portion of the n-type contact layer 141. The MQW emission layer 145 is formed by alternately stacking five undoped GaN barrier layers each having a thickness of about 4 nm and four undoped $Ga_{0.85}In_{0.15}N$ well layers each having a thickness of about 4 nm.

A p-type first cladding layer 146 of Mg-doped GaN having a thickness of about 40 nm is formed on the MQW emission layer 145. A p-type second cladding layer 147 of Mg-doped AlGaN (Al composition: 0.08) having a width of about 2 μm and a thickness of about 0.45 μm is formed on the upper surface of the p-type first cladding layer 146. A cap layer 148 of p-type GaN having a thickness of about 50 nm is formed to be in contact substantially with the overall upper surface of the p-type second cladding layer 147. The p-type second cladding layer 147 and the cap layer 148 form a current path portion (ridge portion) 149 having a thickness W3 of about 2 μm.

A mask layer 150 of a silicon nitride such as $Si_3N_4$ having an opening of about 10 μm in width around the current path portion 149 is formed on the upper surface of the p-type first cladding layer 146. A current blocking layer 151 of Si-doped GaInN (In composition: 0.2) having a thickness of about 3 μm is formed on the upper surface of the part of the p-type first cladding layer 146 exposed in the opening of the mask layer 150 and on a partial region of the upper surface of the mask layer 150 to fill up the side portions of the current path portion 149. In this case, the total width W4 (about 10 μm) of the current path portion 149 and the current blocking layer 151 is set in the range of at least three times and not more than seven times (five times in this embodiment) the width W3 (about 2 μm) of the current path portion 149.

A p-type contact layer 152 of Mg-doped GaN having a thickness of about 3 μm to about 5 μm is formed on the current path portion 149 and the current blocking layer 151 to cover substantially the overall upper surface of the current path portion 149 (the cap layer 148) and a partial region of the upper surface of the current blocking layer 151. Each of the layers 141 to 148, 151 and 152 has a wurtzite structure, and is formed by growth in the [0001] direction of the nitride-based semiconductor.

A p-side electrode 153 consisting of Au/Pd is formed on the p-type contact layer 151. An n-side electrode 154 consisting of Au/Ti is formed on an exposed surface portion of the n-type contact layer 141.

Figure 51:
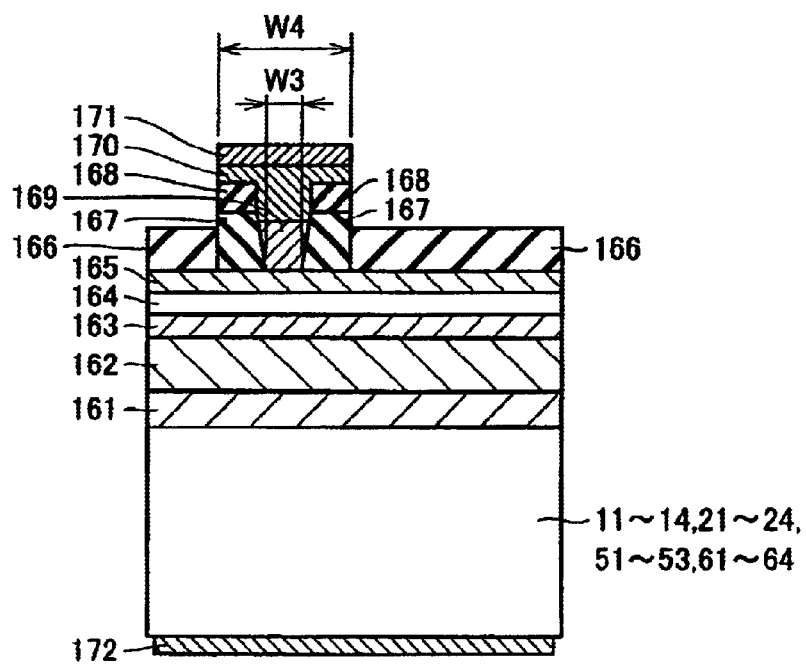
FIG. 51 is a sectional view showing another exemplary structure of the nitride-based semiconductor laser device formed on each first area according to the eleventh embodiment shown in FIG. 49.

Referring to FIG. 51 showing another exemplary nitride-based semiconductor laser device according to the eleventh embodiment, an anti-cracking layer 161 of n-type $Ga_{0.95}In_{0.05}N$ having a thickness of about 0.1 μm, an n-type second cladding layer 162 of Si-doped $Al_{0.3}Ga_{0.7}N$ having a thickness of about 1 μm, an n-type first cladding layer 163 of Si-doped GaN having a thickness of about 50 nm and an MQW emission layer 164 consisting of multiple quantum wells (MQW) of GaInN are formed on a conductive substrate similar to the Si substrate employed in the second, third, sixth or seventh embodiment. The MQW emission layer 164 is formed by alternatively stacking five undoped GaN barrier layers each having a thickness of about 4 nm and four undoped $Ga_{0.85}In_{0.15}N$ well layers each having a thickness of about 4 nm.

A p-type first cladding layer 165 of Mg-doped GaN having a thickness of about 40 nm is formed on the MQW emission layer 164. A mask layer 166 of a silicon nitride such as $Si_3N_4$ having an opening of about 8 μm is formed on a partial region of the upper surface of the p-type first cladding layer 165. A current blocking layer 167 of undoped GaInN provided with an opening on its center and having a thickness of about 3 μm is formed on the upper surface portion of the p-type first cladding layer 165 exposed in the opening of the mask layer 166 with a width W4 of about 8 μm. A p-type second cladding layer 169 of Mg-doped AlGaN (Al composition: 0.08) having a thickness of about 0.45 μm is formed on the part of the p-type first cladding layer 165 located in the opening of the current blocking layer 167. This p-type second cladding layer 169 is formed in an inverse mesa shape (inverse trapezoidal shape) so that the surface of the p-type second cladding layer 169 closer to the p-type first cladding layer 165 has a width W3 of about 2 μm. The side surfaces of the p-type second cladding layer 169 are in contact with the inner side surface of the opening of the current blocking layer 167.

A mask layer 168 of a silicon nitride such as $Si_3N_4$ is formed on the upper surface of the current blocking layer 167. A p-type contact layer 170 of Mg-doped GaN having a thickness of about 3 μm to about 5 μm is formed on the p-type second cladding layer 169 and on the mask layer 168. The p-type second cladding layer 169 and the p-type contact layer 170 form a current path portion having the width W3 of about 2 μm. The width (the total width of the current path portion and the current blocking layer 167) W4 (about 8 μm) of the opening of the mask layer 166 is set in the range of at least three times and not more then seven times the width W3 (about 2 μm) of the current path portion (the lower surface of the p-type second cladding layer 169). Each of the layers 161 to 165, 167, 169 and 170 has a wurtzite structure and is formed by growth in the [0001] direction of the nitride-based semiconductor.

A p-side electrode 171 consisting of Au/Pd is formed on the p-type contact layer 170. An n-side electrode 172 consisting of Au/Pd/Ti/Al/Ti is formed on the back surface of the conductive substrate, so that Ti is in contact with the conductive substrate.

According to the eleventh embodiment, a second area including a region having no GaN layer or a region formed with a GaN layer in a small thickness is provided to completely enclose a first area as hereinabove described, whereby an effect of relaxing strain can be further increased.

Twelfth Embodiment

Figure 52:
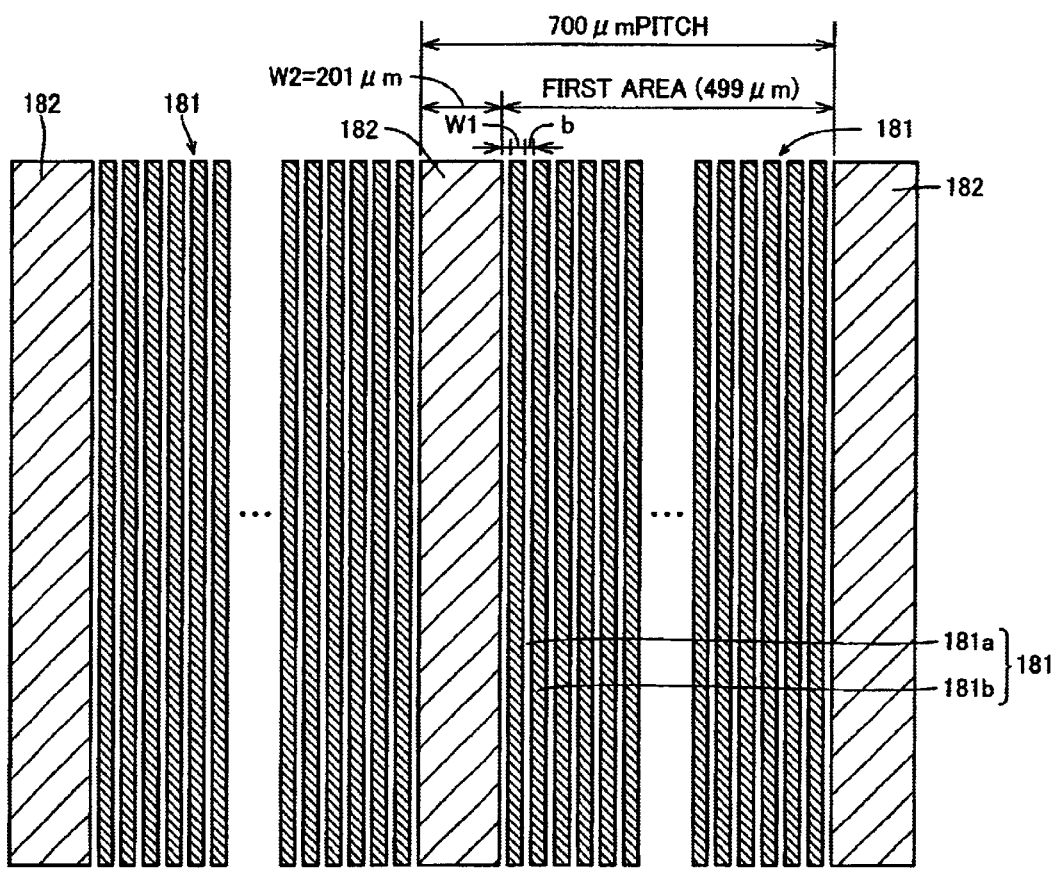
FIG. 52 illustrates a plane layout of first areas provided with nitride-based semiconductor elements and second areas according to a twelfth embodiment of the present invention.
Figure 53:
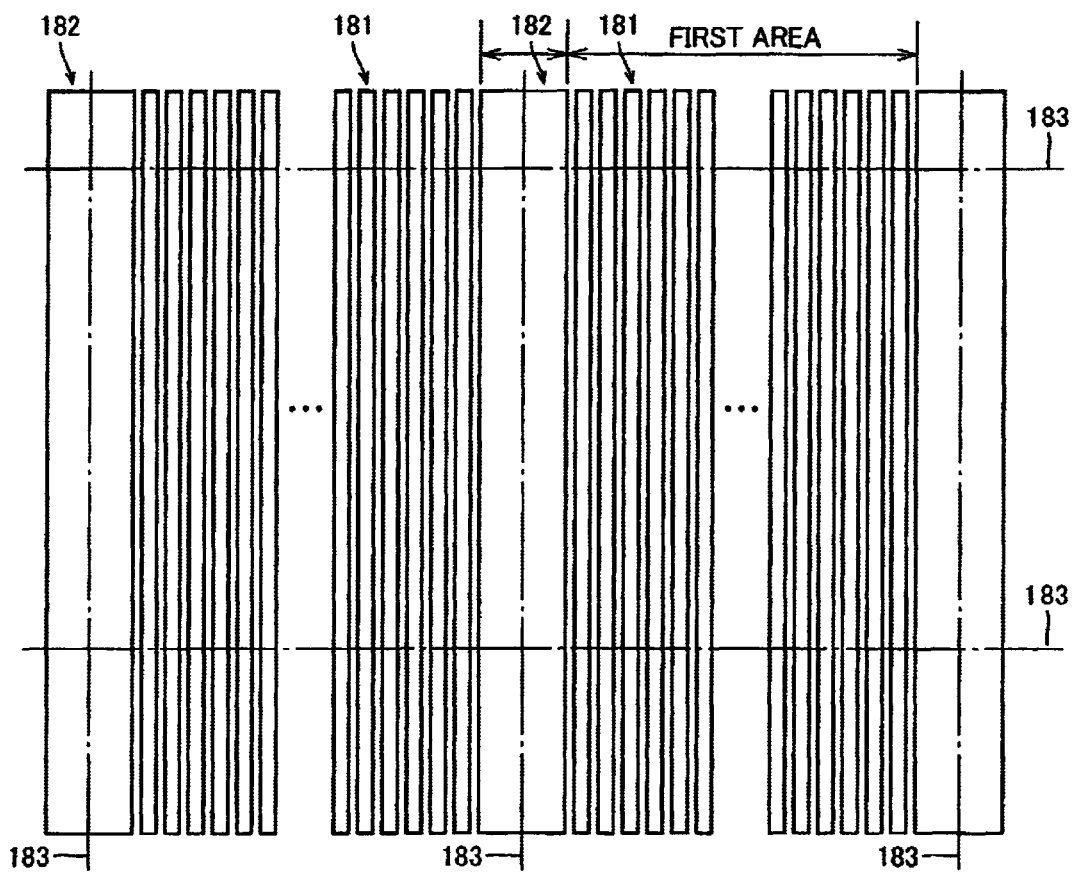
FIG. 53 is a plane layout diagram for illustrating separation of the substrate into each element portions for forming nitride-based semiconductor laser devices on the first areas and the second areas according to the twelfth embodiment shown in FIG. 52.

Referring to FIGS. 52 and 53 showing the plane layout of nitride-based semiconductor laser devices according to a twelfth embodiment of the present invention, second areas 182 are linearly formed to hold both sides of first areas 181 therebetween, dissimilarly to the aforementioned eleventh embodiment. The first areas 181 are examples of the "first region" according to the present invention, and the second areas 182 are examples of the "second region" and the "third portion" according to the present invention. Second portions 181a easily allowing growth of GaN layers and first portions 181b having difficulty in allowing growth of GaN layers are alternately formed on the first areas 181. The width b of the second portions 181a is about 2 μm, and the width W1 of the first portions 181b is about 5 μm. The width W2 of the second areas 182 is 201 μm, and the width of the first areas 181 is 499 μm. Therefore, the first areas 181 are formed at a pitch of 700 μm.

The nitride-based semiconductor laser devices formed on the first areas 181 are divided into chips along isolation lines 183 shown in FIG. 53.

According to the twelfth embodiment, the second areas 182 including the regions having no GaN layers or regions formed with GaN layers in a small thickness are provided to hold the first areas 181 therebetween thereby relaxing strain of GaN layers of the first areas 181. Thus, the GaN layers of the first areas 181 can be effectively prevented from cracking and warpage of a substrate can be suppressed. In this case, strain is relaxed particularly in a direction perpendicular to stripes.

According to the twelfth embodiment, waveguides are continuously formed in a waveguide direction, whereby the number of laser devices fabricative per unit area is advantageously increased as compared with the eleventh embodiment shown in FIG. 49.

Although the present invention has been described and illustrated in detail, it is clearly understood that the same is by way of illustration and example only and is not to be taken by way of limitation, the spirit and scope of the present invention being limited only by the terms of the appended claims.

While the second area is provided with the region having no GaN layer in each of the first to fourth embodiments, for example, the present invention is not restricted to this but the second area may alternatively be provided with a region of a GaN layer having a small thickness. In this case, strain of the GaN layer concentrates to the thin region of the GaN layer provided on the second area, whereby strain of the GaN layer can be relaxed in the first area. Thus, the GaN layer of the first area can be effectively prevented from cracking, and warpage of the substrate can be suppressed.

While the second area is provided with the region of the GaN layer having a small thickness in the seventh embodiment, the present invention is not restricted to this but the second area may alternatively be provided with a region having no GaN layer in the seventh embodiment. In this case, strain of the GaN layer concentrates to the region of the second area having no GaN layer, whereby strain of the GaN layer in the first area can be relaxed. Thus, the GaN layer of the first area can be effectively prevented from cracking and warpage of the substrate can be suppressed.

While the plurality of striped AlGaN buffer layers are formed on the first area in each of the aforementioned first and second embodiments, the present invention is not restricted to this but the pattern of the AlGaN buffer layers may not be striped. More specifically, a plurality of circular, hexagonal or triangular AlGaN buffer layers may alternatively be formed on the substrate. Also according to this structure, the density of dislocations propagating in the c-axis direction is uniformly reduced in the GaN layer. Further, regions particularly reduced in dislocation density are formed on the exposed portions of the substrate except the centers (coalescent regions of the GaN layer) of the portions of the substrate exposed between the AlGaN buffer layers.

In an AlGaN buffer layer formed on a substrate, a plurality of circular, hexagonal or triangular regions may be removed by etching thereby forming a plurality of circular, hexagonal or triangular openings in the AlGaN buffer layer. In this case, dislocations concentrate to portions of a GaN layer formed on centers (coalescent regions of the GaN layer) of the portions of the substrate exposed in the plurality of circular, hexagonal or triangular openings, to consequently form regions having relatively high dislocation density.

As hereinabove described, the density of dislocations in the GaN layer is uniformly reduced while regions having relatively high dislocation density are formed on the centers (coalescent regions of the GaN layer) of the exposed portions of the substrate. When fabricating a semiconductor element, therefore, an active region is preferably formed on a region excluding the centers of the exposed regions of the substrate. Further, regions particularly reduced in dislocation density are formed on the exposed portions of the substrate excluding the centers (coalescent regions of the GaN layer), and hence the active region is further preferably formed on the exposed portions of the substrate excluding the centers (coalescent regions of the GaN layer).

While a sapphire substrate, an Si substrate, an SiC substrate or a GaAs substrate is employed in each of the aforementioned embodiments, the present invention is not restricted to this but an insulating substrate such as a spinel substrate may alternatively be employed in place of the sapphire substrate. Further, a semiconductor substrate consisting of a group IV semiconductor such as Ge other than Si, a group IV—IV semiconductor other than SiC or a group II–IV semiconductor such as ZnSe, or a semiconductor substrate consisting of a group III–V semiconductor such as InP or GaP, for example, having a lattice constant different from that of the nitride-based semiconductor layer may alternatively be employed. The semiconductor substrate may be prepared from any of an insulating substrate, an n-type substrate and a p-type substrate.

While the n-type 6H-SiC substrate is employed in the aforementioned sixth embodiment, an n-type Si substrate having a surface prepared from the (111) plane may alternatively be employed in place of the n-type 6H-SiC substrate in the sixth embodiment. In this case, prescribed regions of the surface of the n-type Si substrate are removed by wet etching or the like thereby forming striped recess portions having a width of about 22 $\mu$m and a height of about 2 $\mu$m and extending in the [1–10] direction. The side surfaces of the recess portions are formed by the (110) and (001) planes. Thus, an n-type Si substrate is formed to have striped recess portions on its surface.

Figure 54:
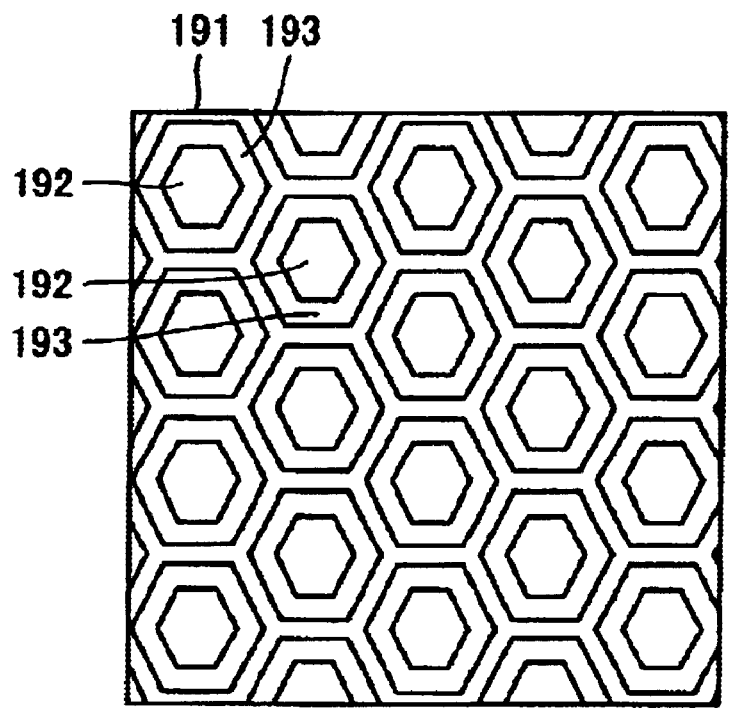
FIG. 54 is a plan view showing an irregularity pattern according to a modification of the present invention.

While the recess portions formed in aforementioned fourth to sixth embodiments are in rectangular shapes in cross section, the present invention is not restricted to this but the recess portions may alternatively be in serrate shapes in cross section. Further alternatively, a substrate having a plurality of circular, hexagonal or triangular recess or projection portions dispersed/arranged thereon may be employed. For example, hexagonal recess or projection portions 192 may be formed on the surface of a substrate 191, as shown in FIG. 54. In this case, the recess or projection portions 192 are formed with inclined portions 193. When this substrate 191 is employed, the density of dislocations is uniformly reduced in a GaN layer similarly to the aforementioned case of employing a sapphire substrate having a striped irregular pattern.

When the substrate 191 formed with hexagonal recess portions 192 is employed, regions particularly reduced in dislocation density are formed on the recess portions 192 excluding the central portions (coalescent regions of the GaN layer).

When the substrate 191 formed with hexagonal projection portions 192 is employed, regions particularly reduced in dislocation density are formed on recess portions between the projection portions 192 excluding the central portions (coalescent regions of the GaN layer) of the recess portions.

As hereinabove described, regions having relatively high dislocation density are formed on the central portions (coalescent regions of the GaN layer) of the GaN layers formed on the hexagonal recess portions 192 of the substrate 191 or on the recess portions between the hexagonal projection portions 192 of the substrate 191. When fabricating a semiconductor element, therefore, an active region is preferably formed on a region excluding the central portions (coalescent regions of the GaN layer) of the GaN layers formed on the hexagonal recess portions 192 of the substrate 191 or on the recess portions between the hexagonal projection portions 192 of the substrate 191. The regions particularly reduced in dislocation density are formed on the hexagonal recess portions excluding the central portions (the coalescent regions of the GaN layer) or on the recess portions excluding the central portions (the coalescent regions of the GaN layer) between the hexagonal projection portions 192, and hence the active layer is further preferably formed on the region on the recess portions excluding the central portions (the coalescent regions of the GaN layer) of the hexagonal recess portions of the substrate 191 or on regions of the recess portions including the central portions (the coalescent regions of the GaN layer) on the recess portions between the hexagonal projection portions of the substrate 191.

When forming the substrate 191 having the recess or projection portions of the hexagonal shape shown in FIG. 54, or a substrate having the recess or projection portions of the triangular shape, the direction for forming each side of the hexagonal or triangular shape may coincide with any crystal orientation of the substrate. When employing a sapphire substrate or an SiC substrate having a surface prepared from the (0001) plane, a hexagonal or triangular shape is preferably formed so that each side coincides with a direction equivalent to the [1–100] direction or the [11–20] direction. When employing an Si substrate having a surface prepared from the (111) plane, a hexagonal or triangular shape is preferably formed so that each side coincides with a direction equivalent to the [1–10] direction or the [11–2] direction.

A substrate of Si, GaAs or SiC is particularly easily etched as compared with a substrate of GaN. When employing a substrate of Si, GaAs or SiC, therefore, striped recess portions can be easily formed on the substrate by etching. Thus, a GaN layer reduced in dislocation density can be easily formed through the striped recess portions.

While each first area is rectangularly formed in each of the aforementioned eleventh and twelfth embodiments, the present invention is not restricted to this but the first area may be formed on a parallelogrammic or equilateral triangular region.

While a nitride-based semiconductor laser device or a nitride-based semiconductor light-emitting diode device is fabricated in each of the aforementioned embodiments, the present invention is not restricted to this but application to another nitride-based semiconductor element such as a transistor or a solar cell is also conceivable.

While an n-layer is formed on the substrate in advance in each of the aforementioned embodiments, a p-layer may alternatively be formed in advance. The crystal structure of the semiconductor may be either a wurtzite structure or a zinc blende structure.

While each semiconductor layer is formed by HVPE or MOVPE in each of the aforementioned embodiments, the present invention is not restricted to this but another crystal growth method may alternatively be employed. For example, each semiconductor layer can be formed by gas source MBE employing TMAl (trimethyl aluminum), TMGa (trimethyl gallium), TMIn (trimethyl indium), $NH_3$, $SiH_4$ or $Cp_2Mg$ (cyclopentadienyl magnesium) as raw material gas.

The combination of the first area and the second area is not restricted to that shown in each of the aforementioned embodiments but properly changeable. For example, the first area according to the first embodiment may be combined with the second area according to the fifth embodiment, or the first area according to the third embodiment may be combined with the second area according to the sixth embodiment. Alternatively, the first area according to the fourth embodiment may be combined with the second area according to the first embodiment, or the first area according to the fifth embodiment may be combined with the second area according to the first embodiment. Also in this case, effects similar to those of the aforementioned first to eighth embodiments can be attained.

While the nitride-based semiconductor layer is grown on the first area by ELOG or PENDEO in each of the aforementioned embodiments, the present invention is not restricted to this but another growth method may alternatively be employed so far as the density of dislocations can be reduced by lateral growth or the like.

While InGaN is employed as the material for the MQW emission layer in each of the aforementioned tenth to twelfth embodiments, the present invention is not restricted to this but an emission layer may alternatively be employed as a material such as AlGaN, GaN, a quantum well structure of AlGaN/GaN/AlGaN.

While each LED chip has a single first area in the aforementioned tenth embodiment, the present invention is not restricted to this but each LED chip may alternatively have plurality of first areas. For example, the LED devices may be separated into each LED chip along every other one-dot chain line 93 shown in FIG. 46 and thereafter each LED chip may have four first areas.

While each nitride-based semiconductor layer is stacked on the (0001) plane of the nitride-based semiconductor in each of the aforementioned first to twelfth embodiments, the present invention is not restricted to this but each nitride-based semiconductor layer may alternatively be stacked in another crystal orientation of the nitride-based semiconductor. For example, each nitride-based semiconductor layer may alternatively be stacked on the (H, K, -H-K, 0) plane such as the (1–100) plane or the (11–20) plane of the nitride-based semiconductor. In this case, no piezoelectric field is formed on the emission layer and hence the radiation efficiency of the emission layer can be improved.

What is claimed is:

1. A nitride-based semiconductor element comprising:
    a first region formed on a prescribed region of a substrate and provided with an element including a first nitride-based semiconductor layer having a prescribed thickness;
    a second region formed on a region of said substrate other than said first region and provided with the first nitride-based semiconductor layer with a thickness smaller than said thickness in said first region; wherein
    said first region provided with said element includes:
        a first portion, formed on said substrate, having difficulty in allowing growth of said first nitride-based semiconductor layer, and
        a second portion, formed on said substrate, easily allowing growth of said first nitride-based semiconductor layer, and
    said second region includes a third portion, formed on said substrate, having difficulty in allowing growth at said first nitride-based semiconductor layer.

2. The nitride-based semiconductor element according to claim 1, wherein
    said first portion of said first region is formed with a first width, and
    said third portion of said second region is formed with a second width larger than said first width.

3. The nitride-based semiconductor element according to claim 1, wherein
    said first portion of said first region having difficulty in allowing growth of said first nitride-based semiconductor layer includes any of a region having no buffer layer, a region having a mask layer and a region having a recess portion,
    said second portion of said first region easily allowing growth of said first nitride-based semiconductor layer includes any of a region having a buffer layer, a region having no mask layer and a region having no recess portion, and
    said third portion of said second region having difficulty in allowing growth of said first nitride-based semiconductor layer includes any of a region having no buffer layer, a region having a mask layer and a region having a recess portion.

4. The nitride-based semiconductor element according to claim 1, wherein
    said first portion of said first region having difficulty in allowing growth of said first nitride-based semiconductor layer includes a region having a first mask layer of a first width,
    said second portion of said first region easily allowing growth of said first nitride-based semiconductor layer includes a region having no mask layer, and
    said third portion of said second region having difficulty in allowing growth of said first nitride-based semiconductor layer includes a region having a second mask layer of a second width larger than said first width.

5. The nitride-based semiconductor element according to claim 1, wherein
    said first portion of said first region having difficulty in allowing growth of said first nitride-based semiconductor layer includes a region having a first width having no buffer layer,
    said second portion of said first region easily allowing growth of said first nitride-based semiconductor layer includes a region having a buffer layer, and
    said third portion of said second region having difficulty in allowing growth of said first nitride-based semiconductor layer includes a region of a second width, larger than said first width, having no buffer layer.

6. The nitride-based semiconductor element according to claim 1, wherein
    said first region provided with said element includes:
        a first portion having a first recess portion of a first depth, having difficulty in allowing growth of said first nitride semiconductor layer, and
        a second portion easily allowing growth of said first nitride-based semiconductor layer, and
    said second region includes a third portion. having a second recess portion of a second depth larger than said first depth, having difficulty in allowing growth of said first nitride-based semiconductor layer.

7. The nitride-based semiconductor element according to claim 1, wherein
    said first portion of said first region having difficulty in allowing growth of said first nitride-based semiconductor layer includes a region having a third recess portion of a first width,
    said second portion of said first region easily allowing growth of said first nitride-based semiconductor layer includes a region having no recess portion, and
    said third portion of said second region having difficulty in allowing growth of said first nitride-based semiconductor layer includes a region having a fourth recess portion of a second width larger than said first width.

8. The nitride-based semiconductor element according to claim 1, wherein
    said first region provided with said element includes:
        a first portion, having a third mask layer of a first thickness, having difficulty in allowing growth of said first nitride-based semiconductor layer, and
        a second portion easily allowing growth of said first nitride-based semiconductor layer, and
        said second region includes a third portion, having a fourth mask layer of a second thickness larger than said first thickness, having difficulty in allowing growth of said first nitride-based semiconductor layer.

9. The nitride-based semiconductor element according to claim 1, wherein said second region is divided into a plurality of regions.

10. The nitride-based semiconductor element according to claim 1, wherein
said second region is formed to enclose said first region in plane.
11. The nitride-based semiconductor element according to claim 10, wherein
said second region is provided in the form of a lattice.
12. The nitride-based semiconductor element according to claim 1, wherein
said second region is formed to hold said first region in plane.
13. The nitride-based semiconductor element according to claim 12, wherein
said second region is linearly formed.
14. The nitride-based semiconductor element according to claim 1, further comprising a nitride-based semiconductor element layer, formed on said first nitride-based semiconductor layer, having a first area.
15. The nitride-based semiconductor element according to claim 1, wherein
said first nitride-based semiconductor layer has a larger thermal expansion coefficient than said substrate.
16. The nitride-based semiconductor element according to claim 1, wherein
said substrate includes either an Si substrate or an SiC substrate.
17. The nitride-based semiconductor element according to claim 1, wherein
said first nitride-based semiconductor layer has a smaller lattice constant than said substrate.
18. The nitride-based semiconductor element according to claim 1. wherein
dislocations are laterally bent thereby reducing the density of vertical dislocations in the portion of said first nitride-based semiconductor layer located on said first region.
19. A nitride-based semiconductor element comprising:
a first region formed on a prescribed region of a substrate and provided with an element including a first nitride-based semiconductor layer having a prescribed thickness; and
a second region formed on a region of said substrate other than said first region and provided with no said first nitride-based semiconductor layer, wherein
said first region provided with said element includes:
a first portion, formed on said substrate, having difficulty in allowing growth of said first nitride-based semiconductor layer, and
a second portion, formed on said substrate, easily allowing growth of said first nitride-based semiconductor layer, and
said second region includes a third portion, formed on said substrate, not allowing growth of said first nitride-based semiconductor layer wherein
said first portion of said first region having difficulty in allowing growth of said first nitride-based semiconductor layer includes any of a region having no buffer and a region having a recess portion,
said second portion of said first region easily allowing growth of said first nitride-based semiconductor layer includes any of a region having a buffer layer and a region having no recess portion, and
said third portion of said second region includes any of a region having no buffer layer, a region having a mask layer.
20. The nitride-based semiconductor element according to claim 19, wherein
said first portion of said first region is formed with a first width, and
said third portion of said second region is formed with a second width larger than said first width.
21. The nitride-based semiconductor element according to claim 19, wherein
said first portion of said first region having difficulty in allowing growth of said first nitride-based semiconductor layer includes a region having a first mask layer of a first width,
said second portion of said first region easily allowing growth of said first nitride-based semiconductor layer includes a region having no mask layer, and
said third portion of said second region includes a region having a second mask layer of a second width larger than said first width.
22. The nitride-based semiconductor element according to claim 19, wherein
said first portion of said first region having difficulty in allowing growth of said first nitride-based semiconductor layer includes a region of a first width having no buffer layer,
said second portion of said first region easily allowing growth of said first nitride-based semiconductor layer includes a region having a buffer layer, and
said third portion of said second region includes a region of a second width, larger than said first width, having no buffer layer.
23. The nitride-based semiconductor element according to claim 19, wherein said second region is divided into a plurality of regions.
24. The nitride-based semiconductor element according to claim 19, wherein
said second region is formed to enclose said first region in plane.
25. The nitride-based semiconductor element according to claim 24, wherein
said second region is provided in the form of a lattice.
26. The nitride-based semiconductor element according to claim 19, wherein
said second region is formed to hold said first region in plane.
27. The nitride-based semiconductor element according to claim 26, wherein
said second region is linearly formed.
28. The nitride-based semiconductor element according to claim 19, further comprising a nitride-based semiconductor element layer, formed on said first nitride-based semiconductor layer, having a first area.
29. The nitride-based semiconductor element according to claim 19, wherein
said first nitride-based semiconductor layer has a larger thermal expansion coefficient than said substrate.
30. The nitride-based semiconductor element according to claim 29, wherein
said substrate includes either an Si substrate or an SiC substrate.
31. The nitride-based semiconductor element according to claim 19, wherein
said first nitride-based semiconductor layer has a smaller lattice constant than said substrate.
32. The nitride-based semiconductor element according to claim 19, wherein
dislocations are laterally bent thereby reducing the density of vertical dislocations in the portion of said first nitride-based semiconductor layer located on said first region.

* * * * *